(12) United States Patent
Hartmann et al.

(10) Patent No.: US 7,244,497 B2
(45) Date of Patent: Jul. 17, 2007

(54) CELLULOSIC FIBERS HAVING ENHANCED REVERSIBLE THERMAL PROPERTIES AND METHODS OF FORMING THEREOF

(75) Inventors: Mark Henry Hartmann, Superior, CO (US); James Brice Worley, Westminster, CO (US)

(73) Assignee: Outlast Technologies, Inc., Boulder, CO (US)

( * ) Notice: Subject to any disclaimer, the term of this patent is extended or adjusted under 35 U.S.C. 154(b) by 479 days.

(21) Appl. No.: 10/638,290

(22) Filed: Aug. 7, 2003

(65) Prior Publication Data

US 2004/0126555 A1    Jul. 1, 2004

Related U.S. Application Data

(63) Continuation-in-part of application No. 10/052,232, filed on Jan. 15, 2002, now Pat. No. 6,855,422, which is a continuation-in-part of application No. 09/960,591, filed on Sep. 21, 2001, now abandoned.

(51) Int. Cl.
*D02G 3/00* (2006.01)
*B32B 5/16* (2006.01)

(52) U.S. Cl. .............. 428/373; 428/401; 428/402; 428/393

(58) Field of Classification Search ............ 428/357, 428/373, 374, 393, 402, 402.2, 402.21, 401
See application file for complete search history.

(56) References Cited

U.S. PATENT DOCUMENTS

| | | | |
|---|---|---|---|
| 4,003,426 A | 1/1977 | Best et al. | |
| 4,111,189 A | 9/1978 | Dizon | |
| 4,122,203 A | 10/1978 | Stahl | |
| 4,169,554 A | 10/1979 | Camp | |
| 4,178,727 A | 12/1979 | Prusinski et al. | |
| 4,213,448 A | 7/1980 | Hebert | |
| 4,219,072 A | 8/1980 | Barlow, Sr. | |

(Continued)

FOREIGN PATENT DOCUMENTS

EP        306303 A2       1/1988

(Continued)

OTHER PUBLICATIONS

Randolph, S.J. et al., "Chap 7 Manufactured Regenerated Fibers" in "Textiles," 8th Ed. Prentice-Hall, Inc. (1998).

(Continued)

*Primary Examiner*—Lynda Salvatore
(74) *Attorney, Agent, or Firm*—Neugeboren Law Firm PC

(57) ABSTRACT

Cellulosic fibers having enhanced reversible thermal properties and methods of forming such cellulosic fibers are described. In one embodiment, a cellulosic fiber includes a fiber body formed of an elongated member. The elongated member includes a cellulosic material and a temperature regulating material dispersed within the cellulosic material. The temperature regulating material includes a phase change material having a transition temperature in the range of −5° C. to 125° C. The cellulosic fiber can be formed via a solution spinning process and can be used in various products where thermal regulating properties are desired. For example, the cellulosic fiber can be used in textiles, apparel, footwear, medical products, containers and packagings, buildings, appliances, and other products.

51 Claims, 4 Drawing Sheets

U.S. PATENT DOCUMENTS

| | | | |
|---|---|---|---|
| 4,237,023 A | 12/1980 | Johnson et al. |
| 4,258,696 A | 3/1981 | Gopal |
| 4,259,198 A | 3/1981 | Kreibich et al. |
| 4,259,401 A | 3/1981 | Chahroudi et al. |
| 4,277,357 A | 7/1981 | Boardman |
| 4,290,416 A | 9/1981 | Maloney |
| 4,294,078 A | 10/1981 | MacCracken |
| 4,332,690 A | 6/1982 | Kimura et al. |
| 4,360,442 A | 11/1982 | Reedt et al. |
| 4,403,644 A | 9/1983 | Hebert |
| 4,403,645 A | 9/1983 | MacCracken |
| 4,460,649 A | 7/1984 | Park et al. |
| 4,462,390 A | 7/1984 | Holdridge et al. |
| 4,498,459 A | 2/1985 | Korin et al. |
| 4,504,402 A | 3/1985 | Chen et al. |
| 4,505,953 A | 3/1985 | Chen et al. |
| 4,513,053 A | 4/1985 | Chen et al. |
| 4,532,917 A | 8/1985 | Taff et al. |
| 4,572,864 A | 2/1986 | Benson et al. |
| 4,585,572 A | 4/1986 | Lane et al. |
| 4,587,279 A | 5/1986 | Salyer et al. |
| 4,587,404 A | 5/1986 | Smith |
| 4,615,381 A | 10/1986 | Maloney |
| 4,617,332 A | 10/1986 | Salyer et al. |
| 4,637,888 A | 1/1987 | Lane et al. |
| 4,690,769 A | 9/1987 | Lane et al. |
| 4,702,853 A | 10/1987 | Benson et al. |
| 4,708,812 A | 11/1987 | Hatfield |
| 4,711,813 A | 12/1987 | Salyer |
| 4,727,930 A | 3/1988 | Bruckner et al. |
| 4,746,479 A | 5/1988 | Hanaki et al. |
| 4,747,240 A | 5/1988 | Voisinet et al. |
| 4,756,958 A | 7/1988 | Bryant et al. |
| 4,807,696 A | 2/1989 | Colvin et al. |
| 4,825,939 A | 5/1989 | Salyer et al. |
| 4,828,542 A | 5/1989 | Hermann |
| 4,851,291 A | 7/1989 | Vigo et al. |
| 4,856,294 A | 8/1989 | Scaringe et al. |
| 4,871,615 A | 10/1989 | Vigo et al. |
| 4,908,166 A | 3/1990 | Salyer |
| 4,908,238 A | 3/1990 | Vigo et al. |
| 4,924,935 A | 5/1990 | Van Winckel |
| 4,964,402 A | 10/1990 | Grim et al. |
| 4,983,798 A | 1/1991 | Eckler et al. |
| 4,988,543 A | 1/1991 | Houle et al. |
| 5,007,478 A | 4/1991 | Sengupta |
| 5,008,133 A | 4/1991 | Herbet et al. |
| 5,053,446 A | 10/1991 | Salyer |
| 5,085,790 A | 2/1992 | Hormansdorfer |
| 5,106,520 A | 4/1992 | Salyer |
| 5,115,859 A | 5/1992 | Roebelen, Jr. et al. |
| 5,140,004 A | 8/1992 | Tamaka et al. |
| 5,153,066 A | 10/1992 | Tanaka et al. |
| 5,162,074 A | 11/1992 | Hills |
| 5,202,150 A | 4/1993 | Benson et al. |
| 5,211,949 A | 5/1993 | Salyer |
| 5,220,954 A | 6/1993 | Longardner et al. |
| 5,254,380 A | 10/1993 | Salyer |
| 5,282,994 A | 2/1994 | Salyer |
| 5,290,904 A | 3/1994 | Colvin et al. |
| 5,366,801 A | 11/1994 | Bryant et al. |
| 5,370,814 A | 12/1994 | Salyer |
| 5,381,670 A | 1/1995 | Tippmann et al. |
| 5,386,701 A | 2/1995 | Cao |
| RE34,880 E | 3/1995 | Salyer |
| 5,415,222 A | 5/1995 | Colvin et al. |
| 5,424,519 A | 6/1995 | Salee |
| 5,435,376 A | 7/1995 | Hart et al. |
| 5,477,917 A | 12/1995 | Salyer |
| 5,499,460 A | 3/1996 | Bryant et al. |
| 5,501,268 A | 3/1996 | Stovall et al. |
| 5,507,337 A | 4/1996 | Rafalovich et al. |
| 5,532,039 A | 7/1996 | Payne et al. |
| 5,552,075 A | 9/1996 | Salyer |
| 5,565,132 A | 10/1996 | Salyer |
| 5,626,936 A | 5/1997 | Alderman |
| 5,637,389 A | 6/1997 | Colvin et al. |
| 5,647,226 A | 7/1997 | Scaringe et al. |
| 5,669,584 A | 9/1997 | Hickey |
| 5,677,048 A | 10/1997 | Pushaw |
| 5,686,034 A | 11/1997 | Frankham et al. |
| 5,687,706 A | 11/1997 | Goswami et al. |
| 5,707,735 A | 1/1998 | Midkiff et al. |
| 5,709,914 A | 1/1998 | Hayes |
| 5,722,482 A | 3/1998 | Buckley |
| 5,750,962 A | 5/1998 | Hyatt |
| 5,755,216 A | 5/1998 | Salyer |
| 5,755,987 A | 5/1998 | Goldstein et al. |
| 5,755,988 A | 5/1998 | Lane et al. |
| 5,763,335 A | 6/1998 | Hermann |
| 5,765,389 A | 6/1998 | Salyer |
| 5,770,295 A | 6/1998 | Alderman |
| 5,785,884 A | 7/1998 | Hammond |
| 5,788,912 A | 8/1998 | Salyer |
| 5,804,297 A | 9/1998 | Colvin et al. |
| 5,851,338 A | 12/1998 | Pushaw |
| 5,851,562 A | 12/1998 | Haggard et al. |
| 5,855,999 A | 1/1999 | McCormack |
| 5,884,006 A | 3/1999 | Frohlich et al. |
| 5,885,475 A | 3/1999 | Salyer |
| 5,897,952 A | 4/1999 | Vigo et al. |
| 5,899,088 A | 5/1999 | Purdum |
| 5,911,923 A | 6/1999 | Work et al. |
| 5,932,129 A | 8/1999 | Hyatt |
| 5,935,157 A | 8/1999 | Harmon |
| 5,955,188 A | 9/1999 | Pushaw |
| 5,976,400 A | 11/1999 | Muffett et al. |
| 5,997,762 A | 12/1999 | Haget et al. |
| 5,999,699 A | 12/1999 | Hyatt |
| 6,004,662 A | 12/1999 | Buckley |
| 6,025,287 A | 2/2000 | Hermann |
| 6,041,437 A | 3/2000 | Barker et al. |
| 6,047,106 A | 4/2000 | Salyer |
| 6,048,810 A | 4/2000 | Baychar |
| 6,077,597 A | 6/2000 | Pause |
| 6,079,404 A | 6/2000 | Salyer |
| 6,099,555 A | 8/2000 | Sabin |
| 6,099,894 A | 8/2000 | Holman |
| 6,108,489 A | 8/2000 | Frohlich et al. |
| 6,109,338 A | 8/2000 | Butzer |
| 6,116,330 A | 9/2000 | Salyer |
| 6,119,573 A | 9/2000 | Berens et al. |
| 6,120,530 A | 9/2000 | Nuckols et al. |
| 6,125,645 A | 10/2000 | Horn |
| 6,136,217 A | 10/2000 | Haget et al. |
| 6,170,561 B1 | 1/2001 | O'Grady |
| 6,171,647 B1 | 1/2001 | Holman |
| 6,179,879 B1 | 1/2001 | Robinson et al. |
| 6,183,855 B1 | 2/2001 | Buckley |
| 6,185,742 B1 | 2/2001 | Doherty |
| 6,197,415 B1 | 3/2001 | Holman |
| 6,207,738 B1 | 3/2001 | Zuckerman et al. |
| 6,214,303 B1 | 4/2001 | Hoke et al. |
| 6,217,889 B1 | 4/2001 | Lorenzi et al. |
| 6,217,993 B1 | 4/2001 | Pause |
| 6,230,444 B1 | 5/2001 | Pause |
| 6,277,439 B1 | 8/2001 | Painter |
| 6,319,599 B1* | 11/2001 | Buckley .................. 428/308.4 |
| 6,333,108 B1 | 12/2001 | Wilkes et al. |
| 6,362,389 B1 | 3/2002 | McDowall et al. |
| 6,392,033 B1 | 5/2002 | Poggi et al. |
| 6,417,122 B1 | 7/2002 | Newkirk et al. |
| 6,538,130 B1 | 3/2003 | Fischer et al. |
| 6,793,856 B2* | 9/2004 | Hartmann et al. .......... 264/141 |

| | | | |
|---|---|---|---|
| 6,855,422 B2 | 2/2005 | Magill et al. | |

FOREIGN PATENT DOCUMENTS

| | | |
|---|---|---|
| EP | 0306202 A2 | 3/1989 |
| GB | 1 601 585 * | 6/1977 |
| JP | 63-218200 | 3/1989 |
| JP | 03-059134 A | 3/1991 |
| JP | 02-289916 | 6/1992 |
| JP | 06-073667 | 3/1994 |
| JP | 08311716 | 11/1996 |
| JP | 11-200152 A | 7/1999 |
| JP | 10-337362 | 6/2000 |
| JP | 2001-172866 | 6/2001 |
| JP | 2002-317329 | 10/2002 |
| JP | 2002-348780 | 12/2002 |
| TW | 422898 | 2/2001 |
| WO | WO 87/07854 | 12/1987 |
| WO | WO 93/15625 | 8/1993 |
| WO | WO 93/24241 | 12/1993 |
| WO | WO 95/29057 | 11/1995 |
| WO | WO 95/34609 | 12/1995 |
| WO | WO 97/43512 | 11/1997 |
| WO | WO 98/42929 | 10/1998 |
| WO | WO 98/45208 | 10/1998 |
| WO | WO 98/46669 | 10/1998 |
| WO | WO 99/25549 | 5/1999 |
| WO | WO 00/160450 | 6/2000 |
| WO | WO 00/61360 | 10/2000 |
| WO | WO 00/65100 | 11/2000 |
| WO | WO 01/35511 | 5/2001 |
| WO | WO 01/38810 | 5/2001 |
| WO | WO 02/31236 | 10/2001 |
| WO | WO 02/12607 | 2/2002 |
| WO | WO 02/24789 | 3/2002 |
| WO | WO 02/24830 | 3/2002 |
| WO | WO 02/24992 | 3/2002 |
| WO | WO 2006/066291 | 6/2006 |

OTHER PUBLICATIONS

Guo et al., "Solution Miscibility and Phase Change Behavior of a Polyethylene Glycol—Diacetate Cellulose Composite," Laboratory of Cellulose and Lignocellulosics Chemistry, Journal of Applied Polymer Science, vol. 88, 652-658 (2003).

XP-002187982, JP 08 311716 (abstract) DATABASE WPI, Section Ch, Week 199706.

Bryant, Melt Spun Fibers Containing Microencapsulated Phase Change Material, Advances in heat and Mass Transfer in Biotechnology (1999) HTD-vol. 363/BED-vol. 44, pp. 225-234.

US Patent Application Publication—Hartmann—2002/0054964 A1.

Shimbun, Business Update, The Daily Yomiuri, 2003.

* cited by examiner

CELLULOSIC FIBERS HAVING ENHANCED REVERSIBLE THERMAL PROPERTIES AND METHODS OF FORMING THEREOF

CROSS-REFERENCE TO RELATED APPLICATIONS

This application is a continuation-in-part of the patent application of Magill et al., entitled "Multi-component Fibers Having Enhanced Reversible Thermal Properties and Methods of Manufacturing Thereof," U.S. application Ser. No. 10/052,232, filed on Jan. 15, 2002, now U.S. Pat. No. 6,855,422 which is a continuation-in-part of the patent application of Magill et al., entitled "Multi-component Fibers Having Enhanced Reversible Thermal Properties," U.S. application Ser. No. 09/960,591, filed on Sep. 21, 2001, now abandoned the disclosures'of which are incorporated herein by reference in their entireties.

FIELD OF THE INVENTION

The invention relates to fibers having enhanced reversible thermal properties. For example, cellulosic fibers having enhanced reversible thermal properties and methods of forming such cellulosic fibers are described.

BACKGROUND OF THE INVENTION

Many fibers are formed from naturally occurring polymers. Various processing operations can be required to convert these polymers into fibers. In some instances, the resulting fibers can be referred to as regenerated fibers.

An important class of regenerated fibers includes fibers formed from cellulose. Cellulose is a significant component of plant matter, such as, for example, leaves, wood, bark, and cotton. Conventionally, a solution spinning process is used to form fibers from cellulose. A wet solution spinning process is used to form rayon fibers and lyocell fibers, while a dry solution spinning process is used to form acetate fibers. Rayon fibers and lyocell fibers often include cellulose having the same chemical structure as naturally occurring cellulose. However, cellulose included in these fibers often has a shorter molecular chain length relative to naturally occurring cellulose. Acetate fibers often include a chemically modified form of cellulose in which various hydroxyl groups are replaced by acetyl groups.

Fibers formed from cellulose find numerous applications. For example, these fibers can be used to form knitted, woven, or non-woven fabrics, which can be incorporated in products such as apparel or footwear. Fabrics formed from these fibers are generally perceived as comfort fabrics due to their ability to take up moisture and their low retention of body heat. These properties make the fabrics desirable in warm weather by allowing a wearer to feel cooler. However, these same properties can make the fabrics undesirable in cold weather. In cold and damp weather, the fabrics can be particularly undesirable due to rapid removal of body heat when the fabrics are wet.

It is against this background that a need arose to develop the cellulosic fibers described herein.

SUMMARY OF THE INVENTION

In one innovative aspect, the invention relates to a cellulosic fiber having enhanced reversible thermal properties. In one embodiment, the cellulosic fiber includes a fiber body formed of an elongated member. The elongated member includes a cellulosic material and a temperature regulating material dispersed within the cellulosic material. The temperature regulating material includes a phase change material having a transition temperature in the range of −5° C. to 125° C.

In another embodiment, the cellulosic fiber includes a first elongated member. The first elongated member includes a first cellulosic material and a temperature regulating material dispersed within the first cellulosic material. The temperature regulating material includes a phase change material having a transition temperature in the range of 0° C. to 50° C. The cellulosic fiber also includes a second elongated member coupled to the first elongated member. The second elongated member includes a second cellulosic material.

In a further embodiment, the cellulosic fiber includes a core member. The core member includes a phase change material having a transition temperature in the range of 15° C. to 45° C. The cellulosic fiber also includes a sheath member surrounding the core member and forming an exterior of the cellulosic fiber. The sheath member includes a sheath cellulosic material.

In a yet further embodiment, the cellulosic fiber includes a set of island members. At least one island member of the set of island members includes a phase change material having a transition temperature in the range of 15° C. to 45° C. The cellulosic fiber also includes a sea member surrounding each of the set of island members and forming an exterior of the cellulosic fiber. The sea member includes a sea cellulosic material.

In another innovative aspect, the invention relates to a fabric. In one embodiment, the fabric includes a set of cellulosic fibers blended together. The set of cellulosic fibers includes a cellulosic fiber having enhanced reversible thermal properties and including a fiber body formed of an elongated member. The elongated member includes a cellulosic material and a temperature regulating material dispersed within the cellulosic material. The temperature regulating material includes a phase change material having a transition temperature in the range of 15° C. to 45° C.

In a further innovative aspect, the invention relates to a method of forming a cellulosic fiber having enhanced reversible thermal properties. In one embodiment, the method includes mixing a cellulosic material with a temperature regulating material to form a blend. The temperature regulating material includes a phase change material having a transition temperature in the range of 0° C. to 50° C. The method also includes extruding the blend to form the cellulosic fiber. The cellulosic fiber includes a fiber body formed from the blend.

In another embodiment, the method includes mixing a first cellulosic material with a temperature regulating material to form a blend. The temperature regulating material includes a phase change material having a transition temperature in the range of 0° C. to 50° C. The method also includes extruding the blend and a second cellulosic material to form the cellulosic fiber. The cellulosic fiber includes a first elongated member formed from the blend and a second elongated member surrounding the first elongated member and formed from the second cellulosic material.

BRIEF DESCRIPTION OF THE DRAWINGS

For a better understanding of the nature and objects of various embodiments of the invention, reference should be made to the following detailed description taken in conjunction with the accompanying drawings.

DETAILED DESCRIPTION

Figure 1:
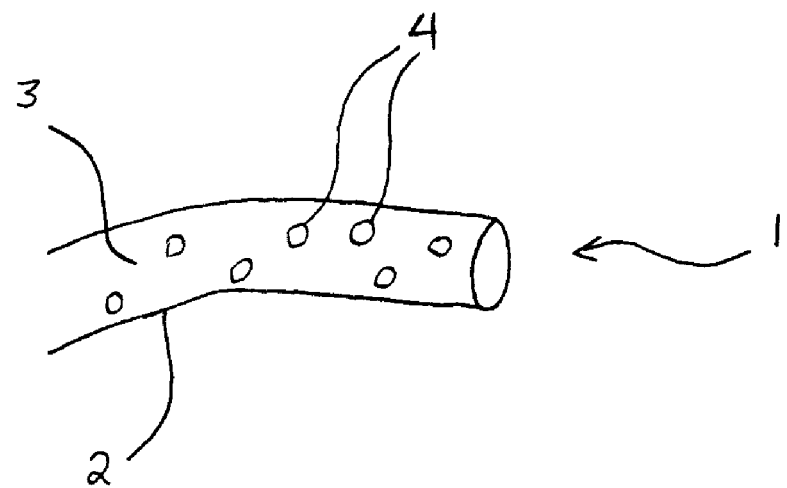
FIG. 1 illustrates a three-dimensional view of a cellulosic fiber according to an embodiment of the invention.

Embodiments of the invention relate to fibers having enhanced reversible thermal properties and methods of forming such fibers. In particular, various embodiments of the invention relate to cellulosic fibers including phase change materials. Cellulosic fibers in accordance with various embodiments of the invention have the ability to absorb and release thermal energy under different environmental conditions. In addition, the cellulosic fibers can exhibit improved processability (e.g., during formation of the cellulosic fibers or a product made therefrom), improved mechanical properties, improved containment of a phase change material within the cellulosic fibers, and higher loading levels of the phase change material.

Cellulosic fibers in accordance with various embodiments of the invention can provide an improved level of comfort when incorporated in products such as, for example, apparel or footwear. In particular, the cellulosic fibers can provide such improved level of comfort under different environmental conditions. The use of phase change materials allows the cellulosic fibers to exhibit "dynamic" heat retention rather than "static" heat retention. Heat retention typically refers to the ability of a material to retain heat (e.g., body heat). A low level of heat retention is often desired in warm weather, while a high level of heat retention is often desired in cold weather. Unlike conventional fibers formed from cellulose, cellulosic fibers in accordance with various embodiments of the invention can exhibit different levels of heat retention under changing environmental conditions. For example, the cellulosic fibers can exhibit a low level of heat retention in warm weather and a high level of heat retention in cold weather, thus maintaining a desired level of comfort under changing weather conditions.

In conjunction with exhibiting "dynamic" heat retention, cellulosic fibers in accordance with various embodiments of the invention can exhibit a high level of moisture absorbency. Moisture absorbency typically refers to the ability of a material to absorb or take up moisture. In some instances, moisture absorbency can be expressed as a percentage weight gain resulting from absorbed moisture relative to a moisture-free weight of the material under a particular environmental condition (e.g., 21° C. and 65 percent relative humidity). Cellulosic fibers in accordance with various embodiments of the invention can exhibit moisture absorbency of at least 5 percent, such as, for example, from about 6 percent to about 15 percent, from about 6 percent to about 13 percent, or from about 11 percent to about 13 percent. A high level of moisture absorbency can serve to reduce the amount of skin moisture, such as, for example, due to perspiration. In addition, moisture absorbed by cellulosic fibers can enhance the heat conductivity of the cellulosic fibers. Thus, for example, when incorporated in apparel or footwear, the cellulosic fibers can serve to reduce the amount of skin moisture as well as lower skin temperature, thereby providing a higher level of comfort in warm weather. The use of phase change materials in the cellulosic fibers further enhances the level of comfort by absorbing or releasing thermal energy to maintain a comfortable skin temperature.

A cellulosic fiber according to some embodiments of the invention can include a set of elongated members. As used herein, the term "set" refers to a collection of one or more elements. In some instances, the cellulosic fiber can include a fiber body formed of the set of elongated members. The fiber body is typically elongated and can have a length that is several times (e.g., 100 times or more) greater than its diameter. The fiber body can have any of various regular or irregular cross-sectional shapes, such as, for example, circular, indented, flower petal-shaped, multi-lobal, octagonal, oval, pentagonal, rectangular, serrated, square-shaped, trapezoidal, triangular, wedge-shaped, and so forth. Various elongated members of the set of elongated members can be coupled (e.g., bonded, combined, joined, or united) to one another to form a unitary fiber body.

According to some embodiments of the invention, a cellulosic fiber can be formed of at least one elongated member that includes a temperature regulating material. Typically, the temperature regulating material includes one or more phase change materials to provide the cellulosic fiber with enhanced reversible thermal properties. For certain applications, a cellulosic fiber can be formed of various elongated members that can include the same cellulosic material or different cellulosic materials, and at least one elongated member has a temperature regulating material dispersed therein. It is contemplated that one or more elongated members can be formed from various other types of polymeric materials. Typically, the temperature regulating material is substantially uniformly dispersed within at least one elongated member. However, depending upon the particular characteristics desired for the cellulosic fiber, the dispersion of the temperature regulating material can be varied within one or more elongated members. Various elongated members can include the same temperature regulating material or different temperature regulating materials.

Depending upon the particular application, a set of elongated members forming a cellulosic fiber can be arranged in one of various configurations. For example, the set of elongated members can include various elongated members arranged in a core-sheath configuration or an island-in-sea configuration. The elongated members can be arranged in other configurations, such as, for example, a matrix or checkerboard configuration, a segmented-pie configuration, a side-by-side configuration, a striped configuration, and so forth. In some instances, the elongated members can be arranged in a bundle form in which the elongated members are generally parallel with respect to one another. One or more elongated members can extend through at least a portion of a length of a fiber body, and, in some instances, the elongated members can be longitudinally co-extensive. For example, the cellulosic fiber can include an inner member that substantially extends through the length of the cellulosic fiber and includes a temperature regulating material. The extent to which the inner member extends through the cellulosic fiber can depend upon, for example, desired thermal regulating properties for the cellulosic fiber. In addition, other factors (e.g., desired mechanical properties or method of forming the cellulosic fiber) can play a role in determining this extent. Thus, in some instances, the inner member can extend through from about a half up to the entire length of the cellulosic fiber to provide desired thermal regulating properties. An outer member can surround the inner member and form an exterior of the cellulosic fiber.

According to some embodiments of the invention, a cellulosic fiber can be between about 0.1 to about 1000 denier or between about 0.1 to about 100 denier. Typically, a cellulosic fiber according to some embodiments of the invention is between about 0.5 to about 15 denier, such as, for example, between about 1 to about 15 denier or between about 0.5 to about 10 denier. As one of ordinary skill in the art will understand, a denier typically refers to a measure of weight per unit length of a fiber and represents the number of grams per 9000 meters of the fiber.

If desired, a cellulosic fiber according to some embodiments of the invention can be further processed to form one or more smaller denier fibers. For example, various elongated members forming the cellulosic fiber can be split apart or fibrillated to form two or more smaller denier fibers, and each smaller denier fiber can include one or more elongated members. It is contemplated that one or more elongated members (or a portion or portions thereof) forming the cellulosic fiber can be mechanically separated, pneumatically separated, dissolved, melted, or otherwise removed to yield one or more smaller denier fibers. Typically, at least one resulting smaller denier fiber includes a temperature regulating material to provide desired thermal regulating properties.

Depending upon the particular application, a cellulosic fiber can also include one or more additives. An additive can be dispersed within one or more elongated members forming the cellulosic fiber. Examples of additives include water, surfactants, dispersants, anti-foam agents (e.g., silicone containing compounds and fluorine containing compounds), antioxidants (e.g., hindered phenols and phosphites), thermal stabilizers (e.g., phosphites, organophosphorous compounds, metal salts of organic carboxylic acids, and phenolic compounds), light or UV stabilizers (e.g., hydroxy benzoates, hindered hydroxy benzoates, and hindered amines), microwave absorbing additives (e.g., multifunctional primary alcohols, glycerine, and carbon), reinforcing fibers (e.g., carbon fibers, aramid fibers, and glass fibers), conductive fibers or particles (e.g., graphite or activated carbon fibers or particles), lubricants, process aids (e.g., metal salts of fatty acids, fatty acid esters, fatty acid ethers, fatty acid amides, sulfonamides, polysiloxanes, organophosphorous compounds, silicon containing compounds, fluorine containing compounds, and phenolic polyethers), fire retardants (e.g., halogenated compounds, phosphorous compounds, organophosphates, organobromides, alumina trihydrate, melamine derivatives, magnesium hydroxide, antimony compounds, antimony oxide, and boron compounds), anti-blocking additives (e.g., silica, talc, zeolites, metal carbonates, and organic polymers), anti-fogging additives (e.g., non-ionic surfactants, glycerol esters, polyglycerol esters, sorbitan esters and their ethoxylates, nonyl phenyl ethoxylates, and alcohol ethyoxylates), anti-static additives (e.g., non-ionics such as fatty acid esters, ethoxylated alkylamines, diethanolamides, and ethoxylated alcohol; anionics such as alkylsulfonates and alkylphosphates; cationics such as metal salts of chlorides, methosulfates or nitrates, and quaternary ammonium compounds; and amphoterics such as alkylbetaines), anti-microbials (e.g., arsenic compounds, sulfur, copper compounds, isothiazolins phthalamides, carbamates, silver base inorganic agents, silver zinc zeolites, silver copper zeolites, silver zeolites, metal oxides, and silicates), crosslinkers or controlled degradation agents (e.g., peroxides, azo compounds, silanes, isocyanates, and epoxies), colorants, pigments, dyes, fluorescent whitening agents or optical brighteners (e.g., bis-benzoxazoles, phenylcoumarins, and bis-(styryl)biphenyls), fillers (e.g., natural minerals and metals such as oxides, hydroxides, carbonates, sulfates, and silicates; talc; clay; wollastonite; graphite; carbon black; carbon fibers; glass fibers and beads; ceramic fibers and beads; metal fibers and beads; flours; and fibers of natural or synthetic origin such as fibers of wood, starch, or cellulose flours), coupling agents (e.g., silanes, titanates, zirconates, fatty acid salts, anhydrides, epoxies, and unsaturated polymeric acids), reinforcement agents, crystallization or nucleation agents (e.g., any material which increases or improves the crystallinity of a polymer, such as to improve rate or kinetics of crystal growth, number of crystals grown, or types of crystals grown), and so forth.

According to some embodiments of the invention, certain treatments or coatings can be applied to a cellulosic fiber to impart additional properties such as, for example, stain resistance, water repellency, softer feel, and moisture management properties. Examples of treatments and coatings include Epic (available from Nextec Applications Inc., Vista, Calif.), Intera (available from Intera Technologies, Inc., Chattanooga, Tenn.), Zonyl Fabric Protectors (available from DuPont Inc., Wilmington, Del.), Scotchgard (available from 3M Co., Maplewood, Minn.), and so forth.

The foregoing discussion provides a general overview of some embodiments of the invention. Attention now turns to FIG. 1, which illustrates a three-dimensional view of a cellulosic fiber 1 according to an embodiment of the invention.

As illustrated in FIG. 1, the cellulosic fiber 1 is a monocomponent fiber that includes a single elongated member 2. The elongated member 2 is generally cylindrical and includes a cellulosic material 3 and a temperature regulating material 4 dispersed within the cellulosic material 3. In the illustrated embodiment, the temperature regulating material 4 can include various microcapsules containing a phase change material, and the microcapsules can be substantially uniformly dispersed throughout the elongated member 2. While it may be desirable to have the microcapsules uniformly dispersed within the elongated member 2, such configuration is not necessary in all applications. The cellulosic fiber 1 can include various percentages by weight of the cellulosic material 3 and the temperature regulating material 4 to provide desired thermal regulating properties, mechanical properties (e.g., ductility, tensile strength, and hardness), and moisture absorbency.

Figure 2:
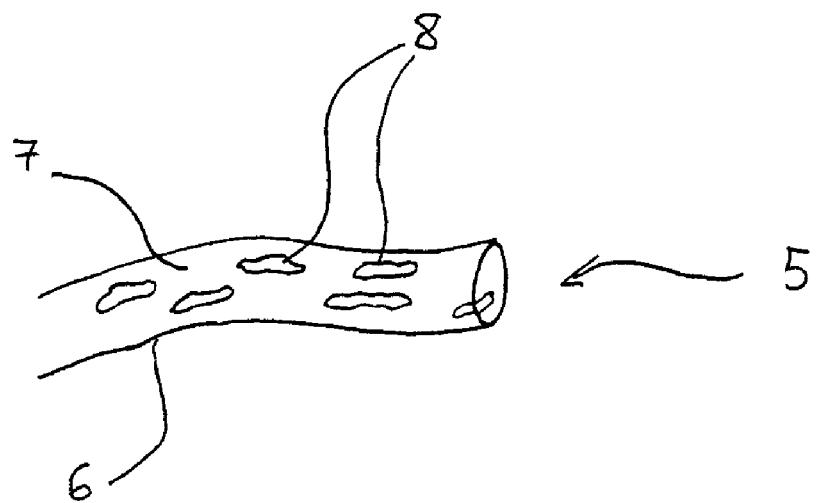
FIG. 2 illustrates a three-dimensional view of another cellulosic fiber according to an embodiment of the invention.

FIG. 2 illustrates a three-dimensional view of another cellulosic fiber 5 according to an embodiment of the invention. As discussed for the cellulosic fiber 1, the cellulosic fiber 5 is a mono-component fiber that includes a single elongated member 6. The elongated member 6 is generally cylindrical and includes a cellulosic material 7 and a temperature regulating material 8 dispersed within the cellulosic material 7. In the illustrated embodiment, the temperature regulating material 8 can include a phase change material in a raw form (e.g., the phase change material is non-encapsulated, i.e., not micro- or macroencapsulated), and the phase change material can be substantially uniformly dispersed throughout the elongated member 6. While it may be desirable to have the phase change material uniformly dispersed within the elongated member 6, such configuration is not necessary in all applications. As illustrated in FIG. 2, the phase change material can form distinct domains that are dispersed within the elongated member 6. The cellulosic fiber 5 can include various percentages by weight of the cellulosic material 7 and the temperature regulating material 8 to provide desired thermal regulating properties, mechanical properties, and moisture absorbency.

Figure 3:
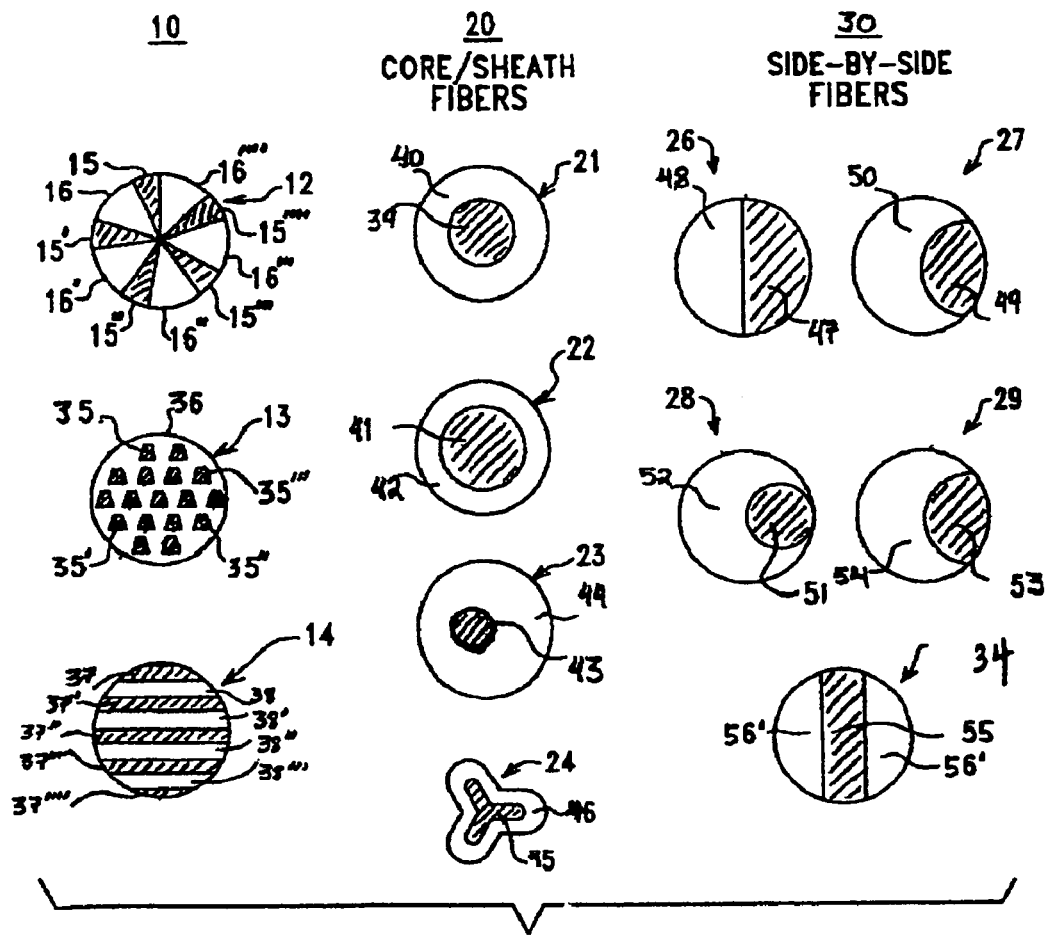
FIG. 3 illustrates cross-sectional views of various cellulosic fibers according to an embodiment of the invention.

Turning next to FIG. 3, cross-sectional views of various cellulosic fibers 12, 13, 14, 21, 22, 23, 24, 26, 27, 28, 29, and 34 are illustrated, according to an embodiment of the invention. As illustrated in FIG. 3, each cellulosic fiber (e.g., the cellulosic fiber 21) is a multi-component component fiber that includes various distinct cross-sectional regions. These cross-sectional regions correspond to various elongated members (e.g., elongated members 39 and 40) that form each cellulosic fiber.

In the illustrated embodiment, each cellulosic fiber includes a first set of elongated members (shown shaded in FIG. 3) and a second set of elongated members (shown unshaded in FIG. 3). Here, the first set of elongated members can be formed from a cellulosic material that has a temperature regulating material dispersed therein. The second set of elongated members can be formed from the same cellulosic material or another cellulosic material having somewhat different properties. In general, various elongated members of the first set of elongated members can be formed from the same cellulosic material or different cellulosic materials. Similarly, various elongated members of the second set of elongated members can be formed from the same cellulosic material or different cellulosic materials. It is contemplated that one or more elongated members can be formed from various other types of polymeric materials.

For certain applications, a temperature regulating material can be dispersed within a second set of elongated members. Different temperature regulating materials can be dispersed within the same elongated member or different elongated members. For example, a first temperature regulating material can be dispersed within a first set of elongated members, and a second temperature regulating material having somewhat different properties can be dispersed within a second set of elongated members. It is contemplated that one or more elongated members can be formed from a temperature regulating material that need not be dispersed within a cellulosic material or other polymeric material. For example, the temperature regulating material can include a polymeric phase change material that provides enhanced reversible thermal properties and that can be used to form a first set of elongated members. In this case, it may be desirable, but not required, that a second set of elongated members adequately surround the first set of elongated members to reduce or prevent loss or leakage of the temperature regulating material. Various elongated members can be formed from the same polymeric phase change material or different polymeric phase change materials.

In the illustrated embodiment, each cellulosic fiber can include various percentages by weight of a first set of elongated members that include a temperature regulating material relative to a second set of elongated members. For example, when thermal regulating properties of a cellulosic fiber are a controlling consideration, a larger proportion of the cellulosic fiber can include a first set of elongated members that include a temperature regulating material. On the other hand, when mechanical properties and moisture absorbency of the cellulosic fiber are a controlling consideration, a larger proportion of the cellulosic fiber can include a second set of elongated members that need not include the temperature regulating material. Alternatively, when balancing thermal regulating properties and other properties of the cellulosic fiber, it can be desirable that the second set of elongated members include the same or a different temperature regulating material.

For example, a cellulosic fiber in the illustrated embodiment can include from about 1 percent to about 99 percent by weight of a first set of elongated members. Typically, the cellulosic fiber includes from about 10 percent to about 90 percent by weight of the first set of elongated members. As an example, a cellulosic fiber can include 90 percent by weight of a first elongated member and 10 percent by weight of a second elongated member. For this example, the first elongated member can include 60 percent by weight of a temperature regulating material, such that the cellulosic fiber includes 54 percent by weight of the temperature regulating material. As another example, the cellulosic fiber can include up to about 50 percent by weight of the first elongated member, which in turn can include up to about 50 percent by weight of the temperature regulating material. Such weight percentages provide the cellulosic fiber with up to about 25 percent by weight of the temperature regulating material and provide effective thermal regulating properties, mechanical properties, and moisture absorbency for the cellulosic fiber. It is contemplated that a percentage by weight of an elongated member relative to a total weight of a cellulosic fiber can be varied, for example, by adjusting a cross-sectional area of the elongated member or by adjusting the extent to which the elongated member extends through a length of the cellulosic fiber.

Referring to FIG. 3, left-hand column 10 illustrates three cellulosic fibers 12, 13, and 14. The cellulosic fiber 12 includes various elongated members arranged in a segmented-pie configuration. In the illustrated embodiment, a first set of elongated members 15, 15', 15", 15'", and 15"" and a second set of elongated members 16, 16', 16", 16'", and 16"" are arranged in an alternating fashion and have cross-sections that are wedge-shaped. In general, the elongated members can have cross-sectional shapes and areas that are the same or different. While the cellulosic fiber 12 is illustrated with ten elongated members, it is contemplated that, in general, two or more elongated members can be arranged in a segmented-pie configuration, and at least one of the elongated members typically will include a temperature regulating material.

The cellulosic fiber 13 includes various elongated members arranged in an island-in-sea configuration. In the illustrated embodiment, a first set of elongated members (e.g., elongated members 35, 35', 35", and 35'") are positioned within and surrounded by a second elongated member 36, thereby forming "islands" within a "sea." Such configuration can serve to provide a more uniform distribution of a temperature regulating material within the cellulosic fiber 13. In the illustrated embodiment, the first set of elongated members have cross-sections that are trapezoidal. In general, the first set of elongated members can have cross-sectional shapes and areas that are the same or different. While the cellulosic fiber 13 is illustrated with seventeen elongated members positioned within and surrounded by the second elongated member 36, it is contemplated that, in general, one or more elongated members can be positioned within and surrounded by the second elongated member 36.

The cellulosic fiber 14 includes various elongated members arranged in a striped configuration. In the illustrated embodiment, a first set of elongated members 37, 37', 37", 37'", and 37"" and a second set of elongated members 38, 38', 38", and 38'" are arranged in an alternating fashion and are shaped as longitudinal slices of the cellulosic fiber 14. In general, the elongated members can have cross-sectional shapes and areas that are the same or different. The cellulosic fiber 14 can be a self-crimping or self-texturing fiber and can impart loft, bulk, insulation, stretch, or other like properties. While the cellulosic fiber 14 is illustrated with nine elongated members, it is contemplated that, in general, two or more elongated members can be arranged in a striped configuration, and at least one of the elongated members typically will include a temperature regulating material.

For the cellulosic fibers 12 and 14, one or more elongated members (e.g., the elongated member 15) of a first set of elongated members can be partially surrounded by one or more adjacent elongated members (e.g., the elongated members 16 and 16''''). When an elongated member including a phase change material is not completely surrounded, it may be desirable, but not required, that a containment structure (e.g., microcapsules) is used to contain the phase change material dispersed within the elongated member. In some instances, the cellulosic fibers 12, 13, and 14 can be further processed to form one or more smaller denier fibers. Thus, for example, the elongated members forming the cellulosic fiber 12 can be split apart, or one or more elongated members (or a portion or portions thereof) can be dissolved, melted, or otherwise removed. A resulting smaller denier fiber can include, for example, the elongated members 15 and 16 coupled to one another.

Middle column 20 of FIG. 3 illustrates four cellulosic fibers 21, 22, 23, and 24. In particular, the cellulosic fibers 21, 22, 23, and 24 each includes various elongated members arranged in a core-sheath configuration.

The cellulosic fiber 21 includes a first elongated member 39 positioned within and surrounded by a second elongated member 40. More particularly, the first elongated member 39 is formed as a core member that includes a temperature regulating material. This core member is concentrically positioned within and completely surrounded by the second elongated member 40 that is formed as a sheath member. In the illustrated embodiment, the cellulosic fiber 21 can include about 25 percent by weight of the core member and about 75 percent by weight of the sheath member.

As discussed for the cellulosic fiber 21, the cellulosic fiber 22 includes a first elongated member 41 positioned within and surrounded by a second elongated member 42. The first elongated member 41 is formed as a core member that includes a temperature regulating material. This core member is concentrically positioned within and completely surrounded by the second elongated member 42 that is formed as a sheath member. In the illustrated embodiment, the cellulosic fiber 22 can include about 50 percent by weight of the core member and about 50 percent by weight of the sheath member.

The cellulosic fiber 23 includes a first elongated member 43 positioned within and surrounded by a second elongated member 44. Here, the first elongated member 43 is formed as a core member that is eccentrically positioned within the second elongated member 44 that is formed as a sheath member. The cellulosic fiber 23 can include various percentages by weight of the core member and the sheath member to provide desired thermal regulating properties, mechanical properties, and moisture absorbency.

As illustrated in FIG. 3, the cellulosic fiber 24 includes a first elongated member 45 positioned within and surrounded by a second elongated member 46. In the illustrated embodiment, the first elongated member 45 is formed as a core member that has a tri-lobal cross-sectional shape. This core member is concentrically positioned within the second elongated member 46 that is formed as a sheath member. The cellulosic fiber 24 can include various percentages by weight of the core member and the sheath member to provide desired thermal regulating properties, mechanical properties, and moisture absorbency.

It is contemplated that, in general, a core member can have any of various regular or irregular cross-sectional shapes, such as, for example, circular, indented, flower petal-shaped, multi-lobal, octagonal, oval, pentagonal, rectangular, serrated, square-shaped, trapezoidal, triangular, wedge-shaped, and so forth. While the cellulosic fibers 21, 22, 23, and 24 are each illustrated with one core member positioned within and surrounded by a sheath member, it is contemplated that two or more core members can be positioned within and surrounded by a sheath member (e.g., in a manner similar to that illustrated for the cellulosic fiber 13). These two or more core members can have cross-sectional shapes and areas that are the same or different. It is also contemplated that a cellulosic fiber can include three or more elongated members arranged in a core-sheath configuration, such that the elongated members are shaped as concentric or eccentric longitudinal slices of the cellulosic fiber. Thus, for example, the cellulosic fiber can include a core member positioned within and surrounded by a sheath member, which, in turn, is positioned within and surrounded by another sheath member.

Right-hand column 30 of FIG. 3 illustrates five cellulosic fibers 26, 27, 28, 29, and 34. In particular, the cellulosic fibers 26, 27, 28, 29, and 34 each includes various elongated members arranged in a side-by-side configuration.

The cellulosic fiber 26 includes a first elongated member 47 positioned adjacent to and partially surrounded by a second elongated member 48. In the illustrated embodiment, the elongated members 47 and 48 have half-circular cross-sectional shapes. Here, the cellulosic fiber 26 can include about 50 percent by weight of the first elongated member 47 and about 50 percent by weight of the second elongated member 48. The elongated members 47 and 48 also can be characterized as being arranged in a segmented-pie or a striped configuration.

As discussed for the cellulosic fiber 26, the cellulosic fiber 27 includes a first elongated member 49 positioned adjacent to and partially surrounded by a second elongated member 50. In the illustrated embodiment, the cellulosic fiber 27 can include about 20 percent by weight of the first elongated member 49 and about 80 percent by weight of the second elongated member 50. The elongated members 49 and 50 also can be characterized as being arranged in a core-sheath configuration, such that the first elongated member 49 is eccentrically positioned with respect to and partially surrounded by the second elongated member 50.

The cellulosic fibers 28 and 29 are examples of mixed-viscosity fibers. The cellulosic fibers 28 and 29 each includes a first elongated member 51 or 53 that has a temperature regulating material dispersed therein and is positioned adjacent to and partially surrounded by a second elongated member 52 or 54.

A mixed-viscosity fiber can be considered to be a self-crimping or self-texturing fiber, such that the fiber's crimping or texturing can impart loft, bulk, insulation, stretch, or other like properties. Typically, a mixed-viscosity fiber includes various elongated members that are formed from different polymeric materials. The different polymeric materials used to form the mixed-viscosity fiber can include polymers with different viscosities, chemical structures, or molecular weights. When the mixed-viscosity fiber is drawn, uneven stresses can be created between various elongated members, and the mixed-viscosity fiber can crimp or bend. In some instances, the different polymeric materials used to form the mixed-viscosity fiber can include polymers having different degrees of crystallinity. For example, a first polymeric material used to form a first elongated member can have a lower degree of crystallinity than a second polymeric material used to form a second elongated member. When the mixed-viscosity fiber is drawn, the first and second polymeric materials can undergo different degrees of crystallization to "lock" an orientation and strength into the mixed-viscosity fiber. A sufficient degree of crystallization can be desired to prevent or reduce reorientation of the mixed-viscosity fiber during subsequent processing (e.g., heat treatment).

For example, for the cellulosic fiber 28, the first elongated member 51 can be formed from a first cellulosic material, and the second elongated member 52 can be formed from a second cellulosic material having somewhat different properties. It is contemplated that the first elongated member 51 and the second elongated member 52 can be formed from the same cellulosic material, and a temperature regulating material can be dispersed within the first elongated member 51 to impart self-crimping or self-texturing properties to the cellulosic fiber 28. It is also contemplated that the first elongated member 51 can be formed from a polymeric phase change material, and the second elongated member 52 can be formed from a cellulosic material having somewhat different properties. The cellulosic fibers 28 and 29 can include various percentages by weight of the first elongated members 51 and 53 and the second elongated members 52 and 54 to provide desired thermal regulating properties, mechanical properties, moisture absorbency, and self-crimping or self-texturing properties.

The cellulosic fiber 34 is an example of an ABA fiber. As illustrated in FIG. 3, the cellulosic fiber 34 includes a first elongated member 55 positioned between and partially surrounded by a second set of elongated members 56 and 56'. In the illustrated embodiment, the first elongated member 55 is formed from a cellulosic material that has a temperature regulating material dispersed therein. Here, the second set of elongated members 56 and 56' can be formed from the same cellulosic material or another cellulosic material having somewhat different properties. In general, the elongated members 55, 56, and 56' can have cross-sectional shapes and areas that are the same or different. The elongated members 55, 56, and 56' also can be characterized as being arranged in a striped configuration.

Figure 4:
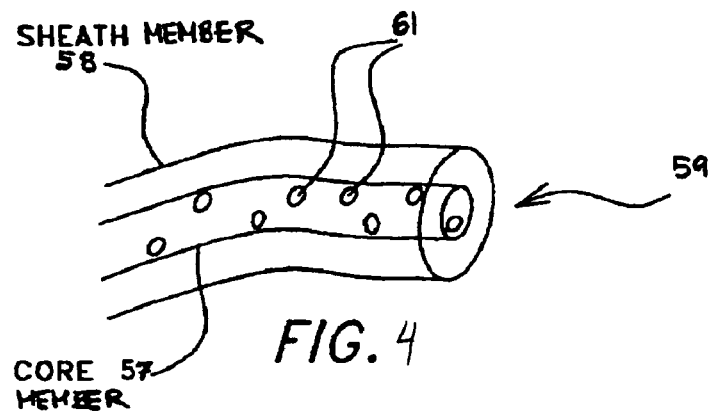
FIG. 4 illustrates a three-dimensional view of a cellulosic fiber having a core-sheath configuration, according to an embodiment of the invention.

Attention next turns to FIG. 4, which illustrates a three-dimensional view of a cellulosic fiber 59 having a core-sheath configuration, according to an embodiment of the invention. The cellulosic fiber 59 includes an elongated and generally cylindrical core member 57 positioned within and surrounded by an elongated and annular-shaped sheath member 58. In the illustrated embodiment, the core member 57 substantially extends through a length of the cellulosic fiber 59 and is completely surrounded or encased by the sheath member 58, which forms an exterior of the cellulosic fiber 59. In general, the core member 57 can be concentrically or eccentrically positioned within the sheath member 58.

As illustrated in FIG. 4, the core member 57 includes a temperature regulating material 61 dispersed therein. In the illustrated embodiment, the temperature regulating material 61 can include various microcapsules containing a phase change material, and the microcapsules can be substantially uniformly dispersed throughout the core member 57. While it may be desirable to have the microcapsules uniformly dispersed within the core member 57, such configuration is not necessary in all applications. The core member 57 and the sheath member 58 can be formed from the same cellulosic material or different cellulosic materials. It is contemplated that either, or both, of the core member 57 and the sheath member 58 can be formed from various other types of polymeric materials. The cellulosic fiber 59 can include various percentages by weight of the core member 57 and the sheath member 58 to provide desired thermal regulating properties, mechanical properties, and moisture absorbency.

Figure 5:
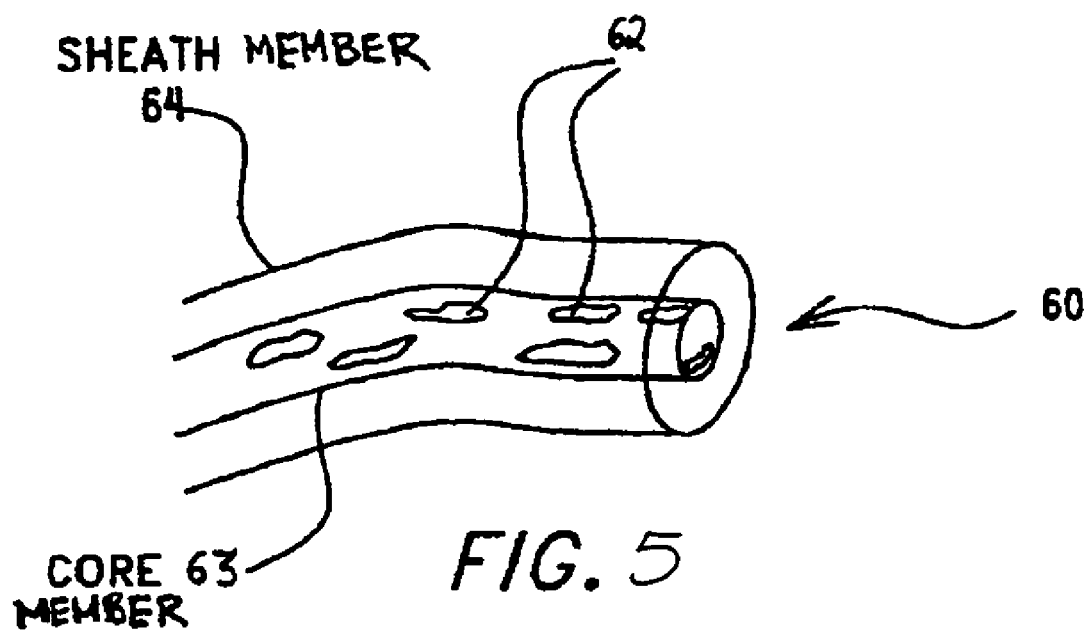
FIG. 5 illustrates a three-dimensional view of another cellulosic fiber having a core-sheath configuration, according to an embodiment of the invention.

FIG. 5 illustrates a three-dimensional view of another cellulosic fiber 60 having a core-sheath configuration, according to an embodiment of the invention. As discussed for the cellulosic fiber 59, the cellulosic fiber 60 includes an elongated and generally cylindrical core member 63 substantially extending through a length of the cellulosic fiber 60. The core member 63 is positioned within and completely surrounded or encased by an elongated and annular-shaped sheath member 64, which forms an exterior of the cellulosic fiber 60. In general, the core member 63 can be concentrically or eccentrically positioned within the sheath member 64.

As illustrated in FIG. 5, the core member 63 includes a temperature regulating material 62 dispersed therein. Here, the temperature regulating material 62 can include a phase change material in a raw form, and the phase change material can be substantially uniformly dispersed throughout the core member 63. While it may be desirable to have the phase change material uniformly dispersed within the core member 63, such configuration is not necessary in all applications. In the illustrated embodiment, the phase change material can form distinct domains that are dispersed within the core member 63. By surrounding the core member 63, the sheath member 64 can serve to enclose the phase change material within the core member 63. Accordingly, the sheath member 64 can reduce or prevent loss or leakage of the phase change material during fiber formation or during end use. The core member 63 and the sheath member 64 can be formed from the same cellulosic material or different cellulosic materials. It is contemplated that either, or both, of the core member 63 and the sheath member 64 can be formed from various other types of polymeric materials. Thus, for example, it is contemplated that the core member 63 can be formed from a polymeric phase change material that need not be dispersed in a cellulosic material. The cellulosic fiber 60 can include various percentages by weight of the core member 63 and the sheath member 64 to provide desired thermal regulating properties, mechanical properties, and moisture absorbency.

Figure 6:
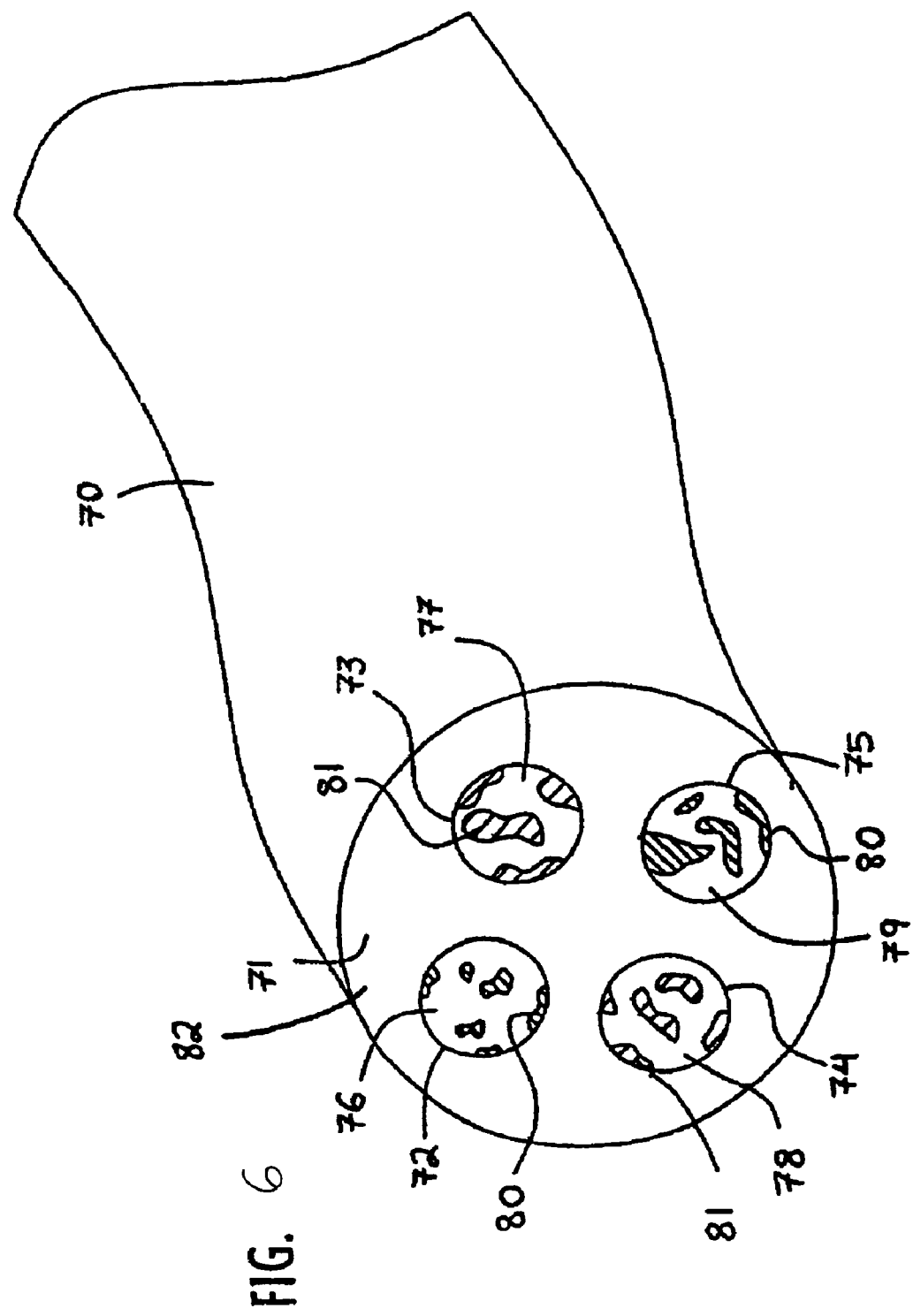
FIG. 6 illustrates a three-dimensional view of a cellulosic fiber having an island-in-sea configuration, according to an embodiment of the invention.

Referring to FIG. 6, a three-dimensional view of a cellulosic fiber 70 having an island-in-sea configuration is illustrated, according to an embodiment of the invention. The cellulosic fiber 70 includes a set of elongated and generally cylindrical island members 72, 73, 74, and 75 positioned within and surrounded by an elongated sea member 71. In the illustrated embodiment, the island members 72, 73, 74, and 75 substantially extend through a length of the cellulosic fiber 70 and are completely surrounded or encased by the sea member 71, which forms an exterior of the cellulosic fiber 70. While four island members are illustrated, it is contemplated that the cellulosic fiber 70 can include more or less islands members depending upon the particular application of the cellulosic fiber 70.

One or more temperature regulating materials can be dispersed within the island members 72, 73, 74, and 75. As illustrated in FIG. 6, the cellulosic fiber 70 includes two different temperature regulating materials 80 and 81. The island members 72 and 75 include the temperature regulating material 80, while the island members 73 and 74 include the temperature regulating material 81. In the illustrated embodiment, the temperature regulating materials 80 and 81 can include different phase change materials in a raw form, and the phase change materials can form distinct domains that are dispersed within respective island members. By surrounding the island members 72, 73, 74, and 75, the sea member 71 can 'serve to enclose the phase change materials within the island members 72, 73, 74, and 75.

In the illustrated embodiment, the sea member 71 is formed of a sea cellulosic material 82, and the island members 72, 73, 74, and 75 are formed of island cellulosic materials 76, 77, 78, and 79, respectively. The sea cellulosic material 82 and the island cellulosic materials 76, 77, 78, and 79 can be the same or can differ from one another in some fashion. It is contemplated that one or more of the sea member 71 and the island members 72, 73, 74, and 75 can be formed from various other types of polymeric materials. Thus, for example, it is contemplated that one or more of the island members 72, 73, 74, and 75 can be formed from a polymeric phase change material that need not be dispersed in a cellulosic material. The cellulosic fiber 70 can include various percentages by weight of the sea member 71 and the island members 72, 73, 74, and 75 to provide desired thermal regulating properties, mechanical properties, and moisture absorbency.

As discussed previously, a cellulosic fiber according to some embodiments of the invention can include one or more temperature regulating materials. A temperature regulating material typically includes one or more phase change materials. In general, a phase change material can be any substance (or any mixture of substances) that has the capability of absorbing or releasing thermal energy to reduce or eliminate heat flow within a temperature stabilizing range. The temperature stabilizing range can include a particular transition temperature or a particular range of transition temperatures. A phase change material used in conjunction with various embodiments of the invention typically is capable of inhibiting a flow of thermal energy during a time when the phase change material is absorbing or releasing heat, typically as the phase change material undergoes a transition between two states (e.g., liquid and solid states, liquid and gaseous states, solid and gaseous states, or two solid states). This action is typically transient. In some instances, a phase change material can effectively inhibit a flow of thermal energy until a latent heat of the phase change material is absorbed or released during a heating or cooling process. Thermal energy can be stored or removed from a phase change material, and the phase change material typically can be effectively recharged by a source of heat or cold. By selecting an appropriate phase change material, a cellulosic fiber can be designed for use in any of various products.

For certain applications, a phase change material can be a solid/solid phase change material. A solid/solid phase change material is a type of phase change material that undergoes a transition between two solid states (e.g., a crystalline or mesocrystalline phase transformation) and hence typically does not become a liquid during use.

A phase change material can include a mixture of two or more substances. By selecting two or more different substances and forming a mixture, a temperature stabilizing range can be adjusted over a wide range for any particular application of a cellulosic fiber. In some instances, a mixture of two or more different substances can exhibit two or more distinct transition temperatures or a single modified transition temperature when incorporated in a cellulosic fiber.

Phase change materials that can be used in conjunction with various embodiments of the invention include various organic and inorganic substances. Examples of phase change materials include hydrocarbons (e.g., straight-chain alkanes or paraffinic hydrocarbons, branched-chain alkanes, unsaturated hydrocarbons, halogenated hydrocarbons, and alicyclic hydrocarbons), hydrated salts (e.g., calcium chloride hexahydrate, calcium bromide hexahydrate, magnesium nitrate hexahydrate, lithium nitrate trihydrate, potassium fluoride tetrahydrate, ammonium alum, magnesium chloride hexahydrate, sodium carbonate decahydrate, disodium phosphate dodecahydrate, sodium sulfate decahydrate, and sodium acetate trihydrate), waxes, oils, water, fatty acids, fatty acid esters, dibasic acids, dibasic esters, 1-halides, primary alcohols, secondary alcohols, tertiary alcohols, aromatic compounds, clathrates, semi-clathrates, gas clathrates, anhydrides (e.g., stearic anhydride), ethylene carbonate, polyhydric alcohols (e.g., 2,2-dimethyl-1,3-propanediol, 2-hydroxymethyl-2-methyl-1,3-propanediol, ethylene glycol, polyethylene glycol, pentaerythritol, dipentaerythritol, pentaglycerine, tetramethylol ethane, neopentyl glycol, tetramethylol propane, 2-amino-2-methyl-1,3-propanediol, monoaminopentaerythritol, diaminopentaerythritol, and tris (hydroxymethyl)acetic acid), polymers (e.g., polyethylene, polyethylene glycol, polyethylene oxide, polypropylene, polypropylene glycol, polytetramethylene glycol, polypropylene malonate, polyneopentyl glycol sebacate, polypentane glutarate, polyvinyl myristate, polyvinyl stearate, polyvinyl laurate, polyhexadecyl methacrylate, polyoctadecyl methacrylate, polyesters produced by polycondensation of glycols (or their derivatives) with diacids (or their derivatives), and copolymers, such as polyacrylate or poly(meth) acrylate with alkyl hydrocarbon side chain or with polyethylene glycol side chain and copolymers including polyethylene, polyethylene glycol, polyethylene oxide, polypropylene, polypropylene glycol, or polytetramethylene glycol), metals, and mixtures thereof.

The selection of a phase change material is typically dependent upon a desired transition temperature or a desired application of a cellulosic fiber that includes the phase change material. For example, a phase change material having a transition temperature near room temperature or normal body temperature can be desirable for clothing applications. In particular, cellulosic fibers including such phase change material can be incorporated into apparel or footwear to maintain a comfortable skin temperature for a user.

A phase change material according to some embodiments of the invention can have a transition temperature in the range of about −5° C. to about 125° C. For clothing applications, a phase change material typically has a transition temperature in the range of about 0° C. to about 50° C., such as, for example, from about 15° C. to about 45° C., from about 22° C. to about 40° C., or from about 22° C. to about 28° C.

Particularly useful phase change materials include paraffinic hydrocarbons having from 10 to 44 carbon atoms (i.e., $C_{10}$-$C_{44}$ paraffinic hydrocarbons). Table 1 sets forth a list of $C_{13}$-$C_{28}$ paraffinic hydrocarbons that can be used as phase change materials in the cellulosic fibers described herein. The number of carbon atoms of a paraffinic hydrocarbon typically correlates with its melting point. For example, n-Octacosane, which includes 28 straight-chain carbon atoms per molecule, has a melting point of about 61.4° C. By comparison, n-Tridecane, which includes 13 straight-chain carbon atoms per molecule, has a melting point of about −5.5° C. n-Octadecane, which includes 18 straight-chain carbon atoms per molecule and has a melting point of about 28.2° C., can be particularly desirable for clothing applications.

TABLE 1

| Paraffinic Hydrocarbon | No. of Carbon Atoms | Melting Point (° C.) |
|---|---|---|
| n-Octacosane | 28 | 61.4 |
| n-Heptacosane | 27 | 59.0 |
| n-Hexacosane | 26 | 56.4 |
| n-Pentacosane | 25 | 53.7 |
| n-Tetracosane | 24 | 50.9 |
| n-Tricosane | 23 | 47.6 |
| n-Docosane | 22 | 44.4 |
| n-Heneicosane | 21 | 40.5 |
| n-Eicosane | 20 | 36.8 |
| n-Nonadecane | 19 | 32.1 |
| n-Octadecane | 18 | 28.2 |
| n-Heptadecane | 17 | 22.0 |
| n-Hexadecane | 16 | 18.2 |
| n-Pentadecane | 15 | 10.0 |
| n-Tetradecane | 14 | 5.9 |
| n-Tridecane | 13 | −5.5 |

Other useful phase change materials include polymeric phase change materials having transition temperatures suitable for a desired application of the resulting cellulosic fibers. Thus, for clothing applications, a polymeric phase change material can have a transition temperature in the range of about 0° C. to about 50° C., such as, for example, from about 22° C. to about 40° C.

A polymeric phase change material can include a polymer (or a mixture of polymers) having any of various chain structures and including one or more types of monomer units. In particular, a polymeric phase change material can include a linear polymer, a branched polymer (e.g., a star-branched polymer, a comb-branched polymer, or a dendritic-branched polymer), or a mixture thereof. For certain applications, a polymeric phase change material desirably includes a linear polymer or a polymer with a small amount of branching to allow for a greater density and a greater degree of ordered molecular packing and crystallization. Such greater degree of ordered molecular packing and crystallization can lead to a larger latent heat and a narrower temperature stabilizing range (e.g., a well-defined transition temperature). A polymeric phase change material can include a homopolymer, a copolymer (e.g., a terpolymer, a statistical copolymer, a random copolymer, an alternating copolymer, a periodic copolymer, a block copolymer, a radial copolymer, or a graft copolymer), or a mixture thereof. Properties of one or more types of monomer units forming a polymeric phase change material can affect a transition temperature of the polymeric phase change material. Accordingly, the selection of the monomer units can be dependent upon a desired transition temperature or a desired application of cellulosic fibers that include the polymeric phase change material. As one of ordinary skill in the art will understand, the reactivity and functionality of a polymer can be altered by addition or replacement of one or more functional groups, such as, for example, amines, amides, carboxyls, hydroxyls, esters, ethers, epoxides, anhydrides, isocyanates, silanes, ketones, aldehydes, and so forth. Also, a polymeric phase change material can include a polymer capable of crosslinking, entanglement, or hydrogen bonding in order to increase toughness or resistance to heat, moisture, or chemicals.

As one of ordinary skill in the art will understand, some polymers can be provided in various forms having different molecular weights, since a molecular weight of a polymer can be determined by processing conditions used for forming the polymer. Accordingly, a polymeric phase change material can include a polymer (or a mixture of polymers) having a particular molecular weight or a particular range of molecular weights. As used herein, the term "molecular weight" can refer to a number average molecular weight or a weight average molecular weight of a polymer (or a mixture of polymers).

For certain applications, a polymeric phase change material can be desirable as a result of having a higher molecular weight, larger molecular size, and higher viscosity relative to non-polymeric phase change materials such as, for example, paraffinic hydrocarbons. As a result of such properties, a polymeric phase change material can exhibit a lesser tendency to leak from a cellulosic fiber during fiber formation or during end use. For some embodiments of the invention, a polymeric phase change material can include polymers having a number average molecular weight in the range of about 400 to about 5,000,000, such as, for example, from about 2,000 to about 5,000,000, from about 8,000 to about 100,000, or from about 8,000 to about 15,000. As one of ordinary skill in the art will understand, a higher molecular weight for a polymer is typically associated with a lower acid number for the polymer. When incorporated within a cellulosic fiber having a core-sheath or island-in-sea configuration, a higher molecular weight or higher viscosity can serve to prevent a polymeric phase change material from flowing through a sheath member or a sea member forming an exterior of the cellulosic fiber. In addition to providing thermal regulating properties, a polymeric phase change material can provide improved mechanical properties when incorporated in cellulosic fibers in accordance with various embodiments of the invention. In some instances, a polymeric phase change material having a desired transition temperature can be mixed with a cellulosic material or, other polymeric material to form an elongated member. In other instances, a polymeric phase change material can provide adequate mechanical properties, such that it can be used to form an elongated member without requiring a cellulosic material or other polymeric material. Such configuration can allow for a higher loading level of the polymeric phase change material and improved thermal regulating properties.

For example, polyethylene glycols can be used as phase change materials in some embodiments of the invention. The number average molecular weight of a polyethylene glycol typically correlates with its melting point. For example, polyethylene glycols having a number average molecular weight in the range of about 570 to about 630 (e.g., Carbowax™ 600, available from The Dow Chemical Company, Midland, Mich.) typically have a melting point in the range of about 20° C. to about 25° C., making them desirable for clothing applications. Other polyethylene glycols that can be useful at other temperature stabilizing ranges include polyethylene glycols having a number average molecular weight of about 400 and a melting point in the range of about 4° C. to about 8° C., polyethylene glycols having a number average molecular weight in the range of about 1,000 to about 1,500 and a melting point in the range of about 42° C. to about 48° C., and polyethylene glycols having a number average molecular weight of about 6,000 and a melting point in the range of about 56° C. to about 63° C. (e.g., Carbowax™ 400, 1500, and 6000, available from The Dow Chemical Company, Midland, Mich.).

Additional useful phase change materials include polymeric phase change materials based on polyethylene glycols that are endcapped with fatty acids. For example, polyethylene glycol fatty acid diesters having a melting point in the range of about 22° C. to about 35° C. can be formed from polyethylene glycols having a number average molecular weight in the range of about 400 to about 600 that are endcapped with stearic acid or lauric acid. Further useful phase change materials include polymeric phase change materials based on tetramethylene glycol. For example, polytetramethylene glycols having a number average molecular weight in the range of about 1,000 to about 1,800 (e.g., Terathane® 1000 and 1800, available from DuPont Inc., Wilmington, Del.) typically have a melting point in the range of about 19° C. to about 36° C. Polyethylene oxides having a melting point in the range of about 60° C. to about 65° C. also can be used as phase change materials in some embodiments of the invention.

For certain applications, polymeric phase change materials can include homopolymers having a melting point in the range of about 0° C. to about 50° C. that can be formed using conventional polymerization processes. Table 2 sets forth melting points of various homopolymers that can be formed from different types of monomer units.

TABLE 2

| Class of Monomer Unit | Homopolymer | Melting Point of Homopolymer (° C.) |
|---|---|---|
| Acrylates, Methacrylates, and and Acrylamides | Polyoctadecyl methacrylate | 36 |
| | Polyhexadecyl methacrylate | 22 |
| | Poly-N-tetradecyl polyacrylamide | 18 |
| | Poly-N-tetradecyl polyacrylamide-1,1 dihydroperfluoro | 32–35 |
| Alkanes and Alkenes | Poly-1-decene | 34–40 |
| | Poly-1-heptene | 17 |
| | cis-polyoctenamer (Vestenamer ® 6213, available from Degussa AG, Frankfurt, Germany) | 38 |
| | Poly-1-octene | 5–10 |
| | Poly-1-nonene | 19–22 |
| | trans-polypentemer | 23–34 |
| | Poly-1-undecene | 36 |
| | cis-polyisoprene | 28–36 |
| | syndiotactic 1,2-poly(1,3-pentadiene) | 10 |
| | 1-methyl-polydodecamethylene | 30 |
| Ethers | Polymethyleneoxytetramethylene oxide (Poly-1,3-dioxapane) | 30 |
| | Polyhexamethyleneoxymethylene oxide | 38 |
| | Polyoxacyclobutane (POX) | 34–36 |
| | n-octadecyl polyacetaldehyde | 18 |
| | Polytetramethylene glycol 1000 (Terathane ® polyTHF 1000, available from DuPont Inc., Wilmington, Delaware) | 25–33 |
| | Polytetramethylene glycol 1400 (Terathane ® polyTHF 1400, available from DuPont Inc., Wilmington, Delaware) | 27–35 |
| | Polytetramethylene glycol 1800 (Terathane ® polyTHF 1800, available from DuPont Inc., Wilmington, Delaware) | 27–38 |
| | Polytetramethylene glycol 2000 (Terathane ® polyTHF 2000, available from DuPont Inc., Wilmington, Delaware) | 28–40 |
| Vinyls | Polydodecyl vinyl ether | 30 |
| | Polyvinyl laurate | 16 |
| | Polyvinyl myristate | 28 |

TABLE 2-continued

| Class of Monomer Unit | Homopolymer | Melting Point of Homopolymer (° C.) |
|---|---|---|
| Sulfur Containing Compounds | 3,3-dimethyl-polytrimethylene sulfide | 19 |
| | Polymethylene sulfide | 35 |
| | Polytetramethylene disulfide | 39–44 |
| | Polysulfur trioxide | 32 |
| | 1-methyl-trimethylene-poly-sulfonyldivalerate | 35 |
| Silicon Containing Compounds | beta-2-polydiethyl siloxane | 17 |
| | Nonamethylene-poly-disiloxanylene dipropionamide-diethyl, dimethyl (Si) | 10 |
| | Nonamethylene-poly-disiloxanylene dipropionamide-tetraethyl (Si) | 10 |
| | Polymethyl hexadecyl siloxane | 35 |
| Amides and Nitrogen Containing Compounds | Poly-(hexamethylene)cyclopropylene dicarboxamide-cis-N,N'-dibutyl | 20 |
| | Poly-(hexamethylene)cyclopropylene dicarboxamide-cis-N,N'-diethyl | 5 |
| | Poly-(hexamethylene)cyclopropylene dicarboxamide-cis-N,N'-diisopropyl | 20 |
| | Poly-(hexamethylene)cyclopropylene dicarboxamide-cis-N,N'-dimethyl | 30 |
| | Polypentamethylene adipamide-2,2,3,3,4,4 hexafluoro (diamine)-cis-N,N'-dibutyl | 15 |
| | Polypentamethylene adipamide-2,2,3,3,4,4 hexafluoro (diamine)-cis-N,N'-diethyl | 20 |
| | Polypentamethylene adipamide-2,2,3,3,4,4 hexafluoro (diamine)-cis-N,N'-diisopropyl | 35 |
| | Polypentamethylene adipamide-2,2,3,3,4,4 hexafluoro (diamine)-cis-N,N'-dimethyl | 30 |
| | Poly-(4,4'-methylene diphenylene sebacamide)-N,N'-diethyl | 32 |
| | Polypentamethylene (hexamethylene disulfonyl)-dicaproamide | 25 |
| Esters | Poly-[ethylene 4,4'-oxydimethylene-di-2-(1,3-dioxolane)-caprylate] | 19 |
| | Polypentamethylene adipate-2,2,3,3,4,4 hexafluoro | 34 |
| | (4-methyl-(R+)-7-polyhydroxyenanthic acid) | 36 |
| | Poly-[4-hydroxy tetramethylene-2-(1,3-dioxolane) caprylic acid] (cis or trans) | 23 |
| | Polypentamethylene 2,2'-dibenzoate | 13 |
| | Polytetramethylene 2,2'-dibenzoate | 36 |
| | Poly-1-methyl-trimethylene 2,2' dibenzoate | 38 |
| | Polycaprolactone glycol (Molecular weight = 830) | 35–45 |

Polymeric phase change materials can include polyesters having a melting point in the range of about 0° C. to about 40° C. that can be formed by, for example, polycondensation of glycols (or their derivatives) with diacids (or their derivatives). Table 3 sets forth melting points of various polyesters that can be formed from different combinations of glycols and diacids.

TABLE 3

| Glycol | Diacid | Melting Point of Polyester (° C.) |
|---|---|---|
| Ethylene glycol | Carbonic | 39 |
| Ethylene glycol | Pimelic | 25 |
| Ethylene glycol | Diglycolic | 17–20 |

TABLE 3-continued

| Glycol | Diacid | Melting Point of Polyester (° C.) |
|---|---|---|
| Ethylene glycol | Thiodivaleric | 25–28 |
| 1,2-Propylene glycol | Diglycolic | 17 |
| Propylene glycol | Malonic | 33 |
| Propylene glycol | Glutaric | 35–39 |
| Propylene glycol | Diglycolic | 29–32 |
| Propylene glycol | Pimelic | 37 |
| 1,3-butanediol | Sulphenyl divaleric | 32 |
| 1,3-butanediol | Diphenic | 36 |
| 1,3-butanediol | Diphenyl methane-m,m'-diacid | 38 |
| 1,3-butanediol | trans-H,H-terephthalic acid | 18 |
| Butanediol | Glutaric | 36–38 |
| Butanediol | Pimelic | 38–41 |
| Butanediol | Azelaic | 37–39 |
| Butanediol | Thiodivaleric | 37 |
| Butanediol | Phthalic | 17 |
| Butanediol | Diphenic | 34 |
| Neopentyl glycol | Adipic | 37 |
| Neopentyl glycol | Suberic | 17 |
| Neopentyl glycol | Sebacic | 26 |
| Pentanediol | Succinic | 32 |
| Pentanediol | Glutaric | 22 |
| Pentanediol | Adipic | 36 |
| Pentanediol | Pimelic | 39 |
| Pentanediol | para-phenyl diacetic acid | 33 |
| Pentanediol | Diglycolic | 33 |
| Hexanediol | Glutaric | 28–34 |
| Hexanediol | 4-Octenedioate | 20 |
| Heptanediol | Oxalic | 31 |
| Octanediol | 4-Octenedioate | 39 |
| Nonanediol | meta-phenylene diglycolic | 35 |
| Decanediol | Malonic | 29–34 |
| Decanediol | Isophthalic | 34–36 |
| Decanediol | meso-tartaric | 33 |
| Diethylene glycol | Oxalic | 10 |
| Diethylene glycol | Suberic | 28–35 |
| Diethylene glycol | Sebacic | 36–44 |
| Diethylene glycol | Phthalic | 11 |
| Diethylene glycol | trans-H,H-terephthalic acid | 25 |
| Triethylene glycol | Sebacic | 28 |
| Triethylene glycol | Sulphonyl divaleric | 24 |
| Triethylene glycol | Phthalic | 10 |
| Triethylene glycol | Diphenic | 38 |
| para-dihydroxy-methyl benzene | Malonic | 36 |
| meta-dihydroxy-methyl benzene | Sebacic | 27 |
| meta-dihydroxy-methyl benzene | Diglycolic | 35 |

In some instances, a polymeric phase change material having a desired transition temperature can be formed by reacting a phase change material (e.g., a phase change material discussed above) with a polymer (or a mixture of polymers). Thus, for example, n-octadecylic acid (i.e., stearic acid) can be reacted or esterified with polyvinyl alcohol to yield polyvinyl stearate, or dodecanoic acid (i.e., lauric acid) can be reacted or esterified with polyvinyl alcohol to yield polyvinyl laurate. Various combinations of phase change materials (e.g., phase change materials with one or more functional groups such as amine, carboxyl, hydroxyl, epoxy, silane, sulfuric, and so forth) and polymers can be reacted to yield polymeric phase change materials having desired transition temperatures.

Polymeric phase change materials having desired transition temperatures can be formed from various types of monomer units. For example, similar to polyoctadecyl methacrylate, a polymeric phase change material can be formed by polymerizing octadecyl methacrylate, which can be formed by esterification of octadecyl alcohol with methacrylic acid. Also, polymeric phase change materials can be formed by polymerizing a polymer (or a mixture of polymers). For example, poly-(polyethylene glycol) methacrylate, poly-(polyethylene glycol) acrylate, poly-(polytetramethylene glycol) methacrylate, and poly-(polytetramethylene glycol) acrylate can be formed by polymerizing polyethylene glycol methacrylate, polyethylene glycol acrylate, polytetramethylene glycol methacrylate, and polytetramethylene glycol acrylate, respectively. In this example, the monomer units can be formed by esterification of polyethylene glycol (or polytetramethylene glycol) with methacrylic acid (or acrylic acid). It is contemplated that polyglycols can be esterified with allyl alcohol or transesterified with vinyl acetate to form polyglycol vinyl ethers, which in turn can be polymerized to form poly-(polyglycol) vinyl ethers. In a similar manner, it is contemplated that polymeric phase change materials can be formed from homologues of polyglycols, such as, for example, ester or ether endcapped polyethylene glycols and polytetramethylene glycols.

According to some embodiments of the invention, a temperature regulating material can include a phase change material in a raw form. During formation of a cellulosic fiber, a phase change material in a raw form can be provided as a solid in any of various forms (e.g., bulk form, powders, pellets, granules, flakes, and so forth) or as a liquid in any of various forms (e.g., molten form, dissolved in a solvent, and so forth).

According to other embodiments of the invention, a temperature regulating material can include a containment structure that encapsulates, contains, surrounds, absorbs, or reacts with a phase change material. This containment structure can facilitate handling of the phase change material while also offering a degree of protection to the phase change material during formation of a cellulosic fiber or a product made therefrom (e.g., protection from solvents, high temperatures, or shear forces). Moreover, this containment structure can serve to reduce or prevent leakage of the phase change material from the cellulosic fiber during end use. According to some embodiments of the invention, use of a containment structure can be desirable, but not required, when an elongated member having a phase change material dispersed therein is not completely surrounded by another elongated member.

For example, a temperature regulating material can include various microcapsules that contain a phase change material, and the microcapsules can be uniformly, or non-uniformly, dispersed within one or more elongated members forming a cellulosic fiber. The microcapsules can be formed as shells enclosing the phase change material and can include individual microcapsules formed in various regular or irregular shapes (e.g., spherical, ellipsoidal, and so forth) and sizes. The microcapsules can have shapes and sizes that are the same or different. According to some embodiments of the invention, microcapsules can have a maximum linear dimension (e.g., diameter) in the range of about 0.01 to about 100 microns. In some instances, the microcapsules can have a generally spherical shape and can have a maximum linear dimension in the range of about 0.5 to about 10 microns, such as, for example, from about 0.5 to about 3 microns. Other examples of a containment structure include silica particles (e.g., precipitated silica particles, fumed silica particles, and mixtures thereof), zeolite particles, carbon particles (e.g., graphite particles, activated carbon particles, and mixtures thereof), and absorbent materials (e.g., absorbent polymeric materials such as certain cellulosic materials, superabsorbent materials, poly(meth)acrylate materials, metal salts of poly(meth)acrylate materials, and mixtures thereof). For example, a temperature regulating material can include silica particles, zeolite particles, carbon particles, or an absorbent material impregnated with a phase change material.

According to some embodiments of the invention, an elongated member forming a cellulosic fiber can include up to about 100 percent by weight of a temperature regulating material. Typically, an elongated member includes up to about 90 percent by weight of a temperature regulating material. Thus, for example, the elongated member can include up to about 50 percent or up to about 25 percent by weight of the temperature regulating material. For some embodiments of the invention, an elongated member can include from about 5 percent to about 70 percent by weight of a temperature regulating material. Thus, in one embodiment, an elongated member can include from about 5 percent to about 60 percent by weight of a temperature regulating material, and, in other embodiments, an elongated member can include from about 10 percent to about 30 percent or from about 15 percent to about 25 percent by weight of a temperature regulating material.

As discussed previously, a cellulosic fiber according to some embodiments of the invention can include a set of elongated members. Various elongated members of the set of elongated members can be formed from the same cellulosic material or different cellulosic materials. In some instances, the set of elongated members can include a first set of elongated members formed from a first cellulosic material that has a temperature regulating material dispersed therein. In addition, the set of elongated members can include a second set of elongated members formed from a second cellulosic material. It is contemplated that the elongated members can be formed from the same cellulosic material, in which case the first and second cellulosic materials will be the same. It is also contemplated that the temperature regulating material can include a polymeric phase change material that provides adequate mechanical properties. In this case, the polymeric phase change material can be used to form the first set of elongated members without requiring the first cellulosic material.

In general, a cellulosic material can include any cellulose-based polymer (or any mixture of cellulose-based polymers) that has the capability of being formed into an elongated member. A cellulosic material can include a cellulose-based polymer (or a mixture of cellulose-based polymers) having any of various chain structures and including one or more types of monomer units. In particular, a cellulose-based polymer can be a linear polymer or a branched polymer (e.g., star branched polymer, comb branched polymer, or dendritic branched polymer). A cellulose-based polymer can be a homopolymer or a copolymer (e.g., terpolymer, statistical copolymer, random copolymer, alternating copolymer, periodic copolymer, block copolymer, radial copolymer, or graft copolymer). As one of ordinary skill in the art will understand, the reactivity and functionality of a cellulose-based polymer can be altered by addition or replacement of a functional group such as, for example, amine, amide, carboxyl, hydroxyl, ester, ether, epoxide, anhydride, isocyanate, silane, ketone, and aldehyde. Also, a cellulose-based polymer can be capable of crosslinking, entanglement, or hydrogen bonding in order to increase its toughness or its resistance to heat, moisture, or chemicals.

Examples of cellulose-based polymers that can be used to form an elongated member include cellulose and various modified forms of cellulose, such as, for example, cellulose esters (e.g., cellulose acetate, cellulose propionate, cellulose butyrate, cellulose phthalate, and cellulose trimellitate), cellulose nitrate, cellulose phosphate, cellulose ethers (e.g., methyl cellulose, ethyl cellulose, propyl cellulose, and butyl cellulose), other modified forms of cellulose (e.g., carboxy methyl cellulose, hydroxymethyl cellulose, hydroxyethyl cellulose, and cyanoethyl cellulose), and salts or copolymers thereof. Cellulose typically corresponds to a linear homopolymer of D-glucose in which successive monomer units are linked by β-glucoside bonds from an anomeric carbon of one monomer unit to a C-4 hydroxyl group of another monomer unit. Other useful cellulose-based polymers include modified forms of cellulose in which, for example, a certain percentage of hydroxyl groups are replaced by various other types of functional groups. Cellulose acetate typically corresponds to a modified form of cellulose in which a certain percentage of hydroxyl groups are replaced by acetyl groups. The percentage of hydroxyl groups that are replaced can depend upon various processing conditions. In some instances, cellulose acetate can have at least about 92 percent of its hydroxyl groups replaced by acetyl groups, and, in other instances, cellulose acetate can have an average of at least about 2 acetyl groups per monomer unit. For certain applications, a cellulosic material can include cellulose-based polymers having an average molecular chain length in the range of about 300 to about 15,000 monomer units. Thus, in one embodiment, a cellulosic material can include cellulose-based polymers having an average molecular chain length in the range of about 10,000 to about 15,000 monomer units. In other embodiments, a cellulosic material can include cellulose-based polymers having an average molecular chain length in the range of about 300 to about 10,000, such as, for example, from about 300 to about 450 monomer units, from about 450 to about 750 monomer units, or from about 750 to about 10,000 monomer units.

It is contemplated that one or more elongated members can be formed from various other types of polymeric materials. Thus, in some embodiments of the invention, an elongated member can be formed from any fiber-forming polymer (or any mixture of fiber-forming polymers). Examples polymers that can be used to form an elongated member include polyamides (e.g., Nylon 6, Nylon 6/6, Nylon 12, polyaspartic acid, polyglutamic acid, and so forth), polyamines, polyimides, polyacrylics (e.g., polyacrylamide, polyacrylonitrile, esters of methacrylic acid and acrylic acid, and so forth), polycarbonates (e.g., polybisphenol A carbonate, polypropylene carbonate, and so forth), polydienes (e.g., polybutadiene, polyisoprene, polynorbornene, and so forth), polyepoxides, polyesters (e.g., polyethylene terephthalate, polybutylene terephthalate, polytrimethylene terephthalate, polycaprolactone, polyglycolide, polylactide, polyhydroxybutyrate, polyhydroxyvalerate, polyethylene adipate, polybutylene adipate, polypropylene succinate, and so forth), polyethers (e.g., polyethylene glycol (polyethylene oxide), polybutylene glycol, polypropylene oxide, polyoxymethylene (paraformaldehyde), polytetramethylene ether (polytetrahydrofuran), polyepichlorohydrin, and so forth), polyfluorocarbons, formaldehyde polymers (e.g., urea-formaldehyde, melamine-formaldehyde, phenol formaldehyde, and so forth), natural polymers (e.g., chitosans, lignins, waxes, and so forth), polyolefins (e.g., polyethylene, polypropylene, polybutylene, polybutene, polyoctene, and so forth), polyphenylenes (e.g., polyphenylene oxide, polyphenylene sulfide, polyphenylene ether sulfone, and so forth), silicon containing polymers (e.g., polydimethyl siloxane, polycarbomethyl silane, and so forth), polyurethanes, polyureas, polyvinyls (e.g., polyvinyl butyral, polyvinyl alcohol, esters and ethers of polyvinyl alcohol, polyvinyl acetate, polystyrene, polymethylstyrene, polyvinyl chloride, polyvinyl pyrrolidone, polymethyl vinyl ether, polyethyl vinyl ether, polyvinyl methyl ketone, and so forth), polyacetals, polyarylates, and copolymers (e.g., polyethylene-co-vinyl acetate, polyethylene-co-acrylic acid, polybutylene terephthalate-co-polyethylene terephthalate, polylauryllactam-block-polytetrahydrofuran, and so forth).

According to some embodiments of the invention, one or more elongated members can be formed from a carrier polymeric material. A carrier polymeric material can serve as a carrier for a temperature regulating material as a cellulosic fiber is formed in accordance with some embodiments of the invention. A carrier polymeric material can include a polymer (or a mixture of polymers) that facilitates dispersing or incorporating a temperature regulating material within one or more elongated members. In addition, a carrier polymeric material can facilitate maintaining integrity of one or more elongated members during fiber formation and can provide enhanced mechanical properties to the resulting cellulosic fiber. Desirably, a carrier polymeric material can be selected to be sufficiently non-reactive with a temperature regulating material, such that a desired temperature stabilizing range is maintained when the temperature regulating material is dispersed within the carrier polymeric material.

A carrier polymeric material can be used in conjunction with, or as an alternative to, a cellulosic material when forming one or more elongated members. In some instances, a carrier polymeric material can serve as a containment structure to facilitate handling of a phase change material while also offering a degree of protection to the phase change material during formation of a cellulosic fiber or a product made therefrom. During formation of a cellulosic fiber, a carrier polymeric material can be provided as a solid in any of various forms (e.g., bulk form, powders, pellets, granules, flakes, and so forth) and can have a temperature regulating material dispersed therein. Thus, for example, powders or pellets formed from the carrier polymeric material having the temperature regulating material dispersed therein can be mixed with a cellulosic material to form a blend, which is used to form one or more elongated members. It is contemplated that a carrier polymeric material can be provided as a liquid in any of various forms (e.g., molten form, dissolved in a solvent, and so forth) and can have a temperature regulating material dispersed therein. It is also contemplated that a cellulosic material can serve as a carrier polymeric material. For example, a cellulosic material having a temperature regulating material dispersed therein can be mixed with the same or a different cellulosic material to form a blend, which is used to form one or more elongated members.

For certain applications, a carrier polymeric material can include a polymer (or a mixture of polymers) that is compatible or miscible with or has an affinity for a temperature regulating material. Such affinity can depend on a number of factors, such as, for example, similarity of solubility parameters, polarities, hydrophobic characteristics, or hydrophilic characteristics of the carrier polymeric material and the temperature regulating material. An affinity for a temperature regulating material can facilitate dispersion of the temperature regulating material in an intermediate molten, liquid, or dissolved form of a carrier polymeric material during formation of a cellulosic fiber. Ultimately, such affinity can facilitate incorporation of more uniform or greater amounts (e.g., higher loading levels) of a phase change material in the cellulosic fiber.

For embodiments of the invention where a temperature regulating material includes a containment structure such as microcapsules, a carrier polymeric material can include a polymer (or a mixture of polymers) having an affinity for the containment structure in conjunction with, or as an alternative to, its affinity for a phase change material. For example, if the temperature regulating material includes various microcapsules containing the phase change material, a polymer (or a mixture of polymers) can be selected based on its affinity for the microcapsules (e.g., for a material of which the microcapsules are formed). In some instances, the carrier polymeric material can include the same or a similar polymer as one forming the microcapsules. Thus, for example, if the microcapsules include nylon shells, the carrier polymeric material can be selected to include nylon. Such affinity for the microcapsules can facilitate dispersion of the microcapsules containing the phase change material in an intermediate molten, liquid, or dissolved form of the carrier polymeric material and, thus, facilitates incorporation of more uniform or greater amounts of the phase change material in a cellulosic fiber.

In some instances, a carrier polymeric material can include a polymer (or a mixture of polymers) that has a partial affinity for a temperature regulating material. For example, the carrier polymeric material can include a polymer (or a mixture of polymers) that is semi-miscible with the temperature regulating material. Such partial affinity can be adequate to facilitate dispersion of the temperature regulating material within the carrier polymeric material at higher temperatures and shear conditions. At lower temperatures and shear conditions, such partial affinity can allow the temperature regulating material to separate out. If a phase change material in a raw form is used, such partial affinity can lead to insolubilization of the phase change material and increased phase change material domain formation within the carrier polymeric material and within the resulting cellulosic fiber. Domain formation can lead to improved thermal regulating properties by facilitating transition of the phase change material between two states. In addition, domain formation can serve to reduce or prevent loss or leakage of the phase change material from the cellulosic fiber during fiber formation or during end use.

For example, certain phase change materials such as paraffinic hydrocarbons can be compatible with polyolefins or copolymers of polyolefins at lower concentrations of the phase change materials or when the temperature is above a critical solution temperature. Thus, for example, mixing of a paraffinic hydrocarbon (or a mixture of paraffinic hydrocarbons) and polyethylene or polyethylene-co-vinyl acetate can be achieved at higher temperatures to produce a substantially homogenous blend that can be easily controlled, pumped, and processed in connection with fiber formation. Once the blend has cooled, the paraffinic hydrocarbon can become insoluble and can separate out into distinct domains within a solid material. These domains can allow for pure melting or crystallization of the paraffinic hydrocarbon for an improved thermal regulating property. In addition, these domains can serve to reduce or prevent loss or leakage of the paraffinic hydrocarbon. The solid material having the domains dispersed therein can be processed to form powders or pellets, which can be mixed with a cellulosic material to form a cellulosic fiber.

According to some embodiments of the invention, a carrier polymeric material can include polyethylene-co-vinyl acetate having from about 5 percent to about 90 percent by weight of vinyl acetate, such as, for example, from about 5 percent to about 50 percent by weight of vinyl acetate or from about 18 percent to about 25 percent by weight of vinyl acetate. This content of vinyl acetate can allow for improved temperature miscibility control when mixing a paraffinic hydrocarbon and the polyethylene-co-vinyl acetate to form a blend. In particular, this vinyl acetate content can allow for excellent miscibility at higher temperatures, thus facilitating processing stability and control due to homogeneity of the blend. At lower temperatures (e.g., room temperature or normal commercial fabric use temperatures), the polyethylene-co-vinyl acetate is semi-miscible with the paraffinic hydrocarbon, thus allowing for separation and micro-domain formation of the paraffinic hydrocarbon.

Other polymers that can be included in a carrier polymeric material include high-density polyethylenes having a melt index in the range of about 4 to about 36 g/10 min (e.g., high-density polyethylenes having melt indices of 4, 12, and 36 g/10 min, available from Sigma-Aldrich Corp., St. Louis, Mo.), modified forms of high-density polyethylenes (e.g., Fusabondg® MB100D, available from DuPont Inc., Wilmington, Del.), and modified forms of ethylene propylene rubber (e.g., Fusabond® N MF416D, available from DuPont Inc., Wilmington, Del.). As one of ordinary skill in the art will understand, a melt index typically refers to a measure of the flow characteristics of a polymer (or a mixture of polymers) and inversely correlates with a molecular weight of the polymer (or the mixture of polymers). For polar phase change materials (e.g., polyethylene glycols, polytetramethylene glycols, and their homologues), a carrier polymeric material can include a polar polymer (or a mixture of polar polymers) to facilitate dispersion of the phase change materials. Thus, for example, the carrier polymeric material can include copolymers of polyesters, such as, for example, polybutylene terephthalate-block-polytetramethylene glycols (e.g., Hytrel® 3078, 5544, and 8238, available from DuPont Inc., Wilmington, Del.), and copolymers of polyamides, such as, for example, polyamide-block-polyethers (e.g., Pebax® 2533, 4033, 5533, 7033, MX 1205, and MH 1657, available from ATOFINA Chemicals, Inc., Philadelphia, Pa.).

As discussed previously, a cellulosic material can serve as a carrier polymeric material in some embodiments of the invention. For example, certain phase change materials such as polyethylene glycols can be compatible with cellulose-based polymers in a solution. In particular, mixing of a polyethylene glycol (or a mixture of polyethylene glycols) and cellulose or cellulose acetate can be achieved to produce a substantially homogenous blend as described in the article of Guo et al., "Solution Miscibility and Phase-Change Behavior of a Polyethylene Gycol-Diacetate Cellulose Composite," Journal of Applied Polymer Science, Vol. 88, 652-658 (2003), the disclosure of which is incorporated herein by reference in its entirety. The polyethylene glycol can form distinct domains within a resulting solid material and can undergo a transition between two solid states within these domains. The solid material having the domains dispersed therein can be processed to form powders or pellets, which can be mixed with a cellulosic material to form a cellulosic fiber.

According to some embodiments of the invention, a carrier polymeric material can include a low molecular weight polymer (or a mixture of low molecular weight polymers). As discussed previously, some polymers can be provided in various forms having different molecular weights. Accordingly, a low molecular weight polymer can refer to a low molecular weight form of the polymer. For example, a polyethylene having a number average molecular weight of about 20,000 (or less) can be used as a low molecular weight polymer in an embodiment of the invention. A low molecular weight polymer typically has a low viscosity when heated to form a melt, which low viscosity can facilitate dispersion of a temperature regulating material in the melt. It is contemplated that a desired molecular weight or range of molecular weights of a low molecular weight polymer can depend upon the particular polymer selected (e.g., polyethylene) or upon the method or equipment used to disperse a temperature regulating material in a melt of the low molecular weight polymer.

According to another embodiment of the invention, a carrier polymeric material can include a mixture of a low molecular weight polymer and a high molecular weight polymer. A high molecular weight polymer can refer to a high molecular weight form of the polymer. A high molecular weight polymer typically has enhanced mechanical properties but can have a high viscosity when heated to form a melt. In some instances, a low molecular weight polymer and a high molecular weight polymer can be selected to have an affinity for one another. Such affinity can facilitate forming a blend of the low molecular weight polymer, the high molecular weight polymer, and a temperature regulating material during fiber formation and can facilitate incorporation of more uniform or greater amounts of a phase change material in a cellulosic fiber. According to some embodiments of the invention, a low molecular weight polymer can serve as a compatibilizing link between a high molecular weight polymer and a temperature regulating material to facilitate incorporating the temperature regulating material in a cellulosic fiber.

Cellulosic fibers in accordance with various embodiments of the invention can be formed using various methods, including, for example, a solution spinning process (wet or dry). In a solution spinning process, one or more cellulosic materials and one or more temperature regulating materials can be delivered to orifices of a spinneret. As one of ordinary skill in the art will understand, a spinneret typically refers to a portion of a fiber forming apparatus that delivers molten, liquid, or dissolved materials through orifices for extrusion into an outside environment. A spinneret typically includes from about 1 to about 500,000 orifices per meter of length of the spinneret. A spinneret can be implemented with holes drilled or etched through a plate or with any other structure capable of issuing desired fibers.

A cellulosic material can be initially provided in any of various forms, such as, for example, sheets of cellulose, wood pulp, cotton linters, and other sources of substantially purified cellulose. Typically, a cellulosic material is dissolved in a solvent prior to passing through the orifices of the spinneret. In some instances, the cellulosic material can be processed (e.g., chemically treated) prior to dissolving the cellulosic material in the solvent. For example, the cellulosic material can be immersed in a basic solution (e.g., caustic soda), squeezed through rollers, and then shredded to form crumbs. The crumbs can then be treated with carbon disulfide to form cellulose xanthate. As another example, the cellulosic material can be mixed with a solution of glacial acetic acid, acetic anhydride, and a catalyst and then aged to form cellulose acetate, which can precipitate from the solution in the form of flakes.

The composition of a solvent used to dissolve a cellulosic material can vary depending upon a desired application of the resulting cellulosic fibers. For example, crumbs of cellulose xanthate as discussed above can be dissolved in a basic solvent (e.g., caustic soda or 2.8 percent sodium hydroxide solution) to form a viscous solution. As another example, precipitated flakes of cellulose acetate as discussed above can be dissolved in acetone to form a viscous solution. Various other types of solvents can be used, such as, for example, a solution of amine oxide or a cuprammonium solution. In some instances, the resulting viscous solution can be filtered to remove any undissolved cellulosic material.

During formation of cellulosic fibers, a temperature regulating material can be mixed with a cellulosic material to form a blend. As a result of mixing, the temperature regulating material can be dispersed within and at least partially enclosed by the cellulosic material. The temperature regulating material can be mixed with the cellulosic material at various stages of fiber formation. Typically, the temperature regulating material is mixed with the cellulosic material prior to passing through the orifices of the spinneret. In particular, the temperature regulating material can be mixed with the cellulosic material prior to or after dissolving the cellulosic material in a solvent. For example, the temperature regulating material can include microcapsules containing a phase change material, and the microcapsules can be dispersed in a viscous solution of the dissolved cellulosic material. In some instances, the temperature regulating material can be mixed with the viscous solution just prior to passing through the orifices of the spinneret.

According to some embodiments of the invention, cellulosic fibers can be formed using a carrier polymeric material. For example, the cellulosic fibers can be formed using powders or pellets formed from the carrier polymeric material having a temperature regulating material dispersed therein. In some instances, the powders or pellets can be formed from a solidified melt mixture of the carrier polymeric material and the temperature regulating material. It is contemplated that the powders or pellets can be initially formed from the carrier polymeric material and can be impregnated or imbibed with the temperature regulating material. It is also contemplated that the powders or pellets can be formed from a dried solution of the carrier polymeric material and the temperature regulating material. During formation of the cellulosic fibers, the powders or pellets can be mixed with a cellulosic material to form a blend at various stages of fiber formation. Typically, the powders or pellets are mixed with the cellulosic material prior to passing through the orifices of the spinneret.

For certain applications, cellulosic fibers can be formed as multi-component fibers. In particular, a first cellulosic material can be mixed with a temperature regulating material to form a blend. The blend and a second cellulosic material can be combined and directed through the orifices of the spinneret in a particular configuration to form respective elongated members of the cellulosic fibers. For example, the blend can be directed through the orifices to form core members or island members, while the second cellulosic material can be directed through the orifices to form sheath members or sea members. Prior to passing through the orifices, the first cellulosic material and the second cellulosic material can be dissolved in the same solvent or different solvents. Portions of the temperature regulating material that are not enclosed by the first cellulosic material can be enclosed by the second cellulosic material upon emerging from the spinneret to reduce or prevent loss or leakage of the temperature regulating material from the resulting cellulosic fibers. It is contemplated that the first cellulosic material need not be used for certain applications. For example, the temperature regulating material can include a polymeric phase change material having a desired transition temperature and providing adequate mechanical properties when incorporated in the cellulosic fibers. The polymeric phase change material and the second cellulosic material can be combined and directed through the orifices of the spinneret in a particular configuration to form respective elongated members of the cellulosic fibers. For example, the polymeric phase change material can be directed through the orifices to form core members or island members, while the second cellulosic material can be directed through the orifices to form sheath members or sea members.

Upon emerging from the spinneret, one or more cellulosic materials typically solidify to form cellulosic fibers. In a wet solution spinning process, the spinneret can be submerged in a coagulation or spinning bath (e.g., a chemical bath), such that, upon exiting the spinneret, one or more cellulosic materials can precipitate and form solid cellulosic fibers. The composition of a spinning bath can vary depending upon a desired application of the resulting cellulosic fibers. For example, the spinning bath can be water, an acidic solution (e.g., a weak acid solution including sulfuric acid), or a solution of amine oxide. In a dry solution spinning process, one or more cellulosic materials can emerge from the spinneret in warm air and solidify due to a solvent (e.g., acetone) evaporating in the warm air.

After emerging from the spinneret, cellulosic fibers can be drawn or stretched utilizing a godet or an aspirator. For example, cellulosic fibers emerging from the spinneret can form a vertically oriented curtain of downwardly moving cellulosic fibers that are drawn between variable speed godet rolls before being wound on a bobbin or cut into staple fiber. Cellulosic fibers emerging from the spinneret can also form a horizontally oriented curtain within a spinning bath and can be drawn between variable speed godet rolls. As another example, cellulosic fibers emerging from the spinneret can be at least partially quenched before entering a long, slot-shaped air aspirator positioned below the spinneret. The aspirator can introduce a rapid, downwardly moving air stream produced by compressed air from one or more air aspirating jets. The air stream can create a drawing force on the cellulosic fibers, causing them to be drawn between the spinneret and the air jet and attenuating the cellulosic fibers. During this portion of fiber formation, one or more cellulosic materials forming the cellulosic fibers can be solidifying. It is contemplated that drawing or stretching of cellulosic fibers can occur before or after drying the cellulosic fibers.

Once formed, cellulosic fibers can be further processed for various fiber applications. In particular, cellulosic fibers in accordance with various embodiments of the invention can be used or incorporated in various products to provide thermal regulating properties to these products. For example, cellulosic fibers can be used in textiles (e.g., fabrics), apparel (e.g., outdoor clothing, drysuits, and protective suits), footwear (e.g., socks, boots, and insoles), medical products (e.g., thermal blankets, therapeutic pads, incontinent pads, and hot/cold packs), containers and packagings (e.g., beverage/food containers, food warmers, seat cushions, and circuit board laminates), buildings (e.g., insulation in walls or ceilings, wallpaper, curtain linings, pipe wraps, carpets, and tiles), appliances (e.g., insulation in house appliances), and other products (e.g., automotive lining material, furnishings, sleeping bags, and bedding).

In some instances, cellulosic fibers can be subjected to, for example, woven, non-woven, knitting, or weaving processes to form various types of plaited, braided, twisted, felted, knitted, woven, or non-woven fabrics. For example, cellulosic fibers can be wound on a bobbin or spun into a yarn and then utilized in various conventional knitting or weaving processes. As another example, cellulosic fibers can be randomly laid on a forming surface (e.g., a moving conveyor screen belt such as a Fourdrinier wire) to form a continuous, non-woven web of cellulosic fibers. In some instances, cellulosic fibers can be cut into short staple fibers prior to forming the web. One potential advantage of employing staple fibers is that a more isotropic non-woven web can be formed, since the staple fibers can be oriented in the web more randomly than longer or uncut fibers (e.g., continuous fibers). The web can then be bonded using any conventional bonding process (e.g., a spunbond process) to form a stable, non-woven fabric for use in manufacturing various textiles. An example of a bonding process involves lifting the web from a moving conveyor screen belt and passing the web through two heated calender rolls. One, or both, of the rolls can be embossed to cause the web to be bonded in numerous spots. Air carded or spun-laid webs can be formed from cellulosic fibers in accordance with some embodiments of the invention.

It is contemplated that fabrics can be formed from cellulosic fibers including two or more different temperature regulating materials. According to some embodiments of the invention, such combination of temperature regulating materials can exhibit two or more distinct transition temperatures. For example, a fabric for use in a glove can be formed from cellulosic fibers that each includes phase change materials A and B. Phase change material A can have a melting point of about 5° C., and phase change material B can have a melting point of about 75° C. This combination of phase change materials in the cellulosic fibers can provide the glove with improved thermal regulating properties in cold environments (e.g., outdoor use during winter conditions) as well as warm environments (e.g., when handling heated objects such as oven trays). In addition, fabrics can be formed from two or more types of cellulosic fibers that differ in some fashion (e.g., formed with different configurations or including different temperature regulating materials). For example, a fabric can be formed with a certain percentage of cellulosic fibers including phase change material A and a remaining percentage of cellulosic fibers including phase change material B. This combination of cellulosic fibers can provide the fabric with improved thermal regulating properties in different environments (e.g., cold and warm environments).

At this point, one of ordinary skill in the art can appreciate a number of advantages associated with various embodiments of the invention. For example, cellulosic fibers in accordance with various embodiments of the invention can provide improved thermal regulating properties along with high moisture absorbency. Such combination of properties allows for an improved level of comfort when the cellulosic fibers are incorporated in products such as, for example, apparel or footwear. A cellulosic fiber in accordance with some embodiments of the invention can include a high loading level of a phase change material within a first set of elongated members. In some instances, such high loading level can be provided because a second set of elongated members can surround the first set of elongated members. The second set of elongated members can compensate for any deficiencies (e.g., mechanical or moisture absorbency deficiencies) of the first set of elongated members. Moreover, the second set of elongated members can include a cellulosic material selected to improve the cellulosic fiber's overall mechanical properties, moisture absorbency, and processability (e.g., by facilitating its formation via a solution spinning process). By surrounding the first set of elongated members, the second set of elongated members can serve to enclose the phase change material within the cellulosic fiber to reduce or prevent loss or leakage of the phase change material.

EXAMPLE

The following example is provided as a guide for a practitioner of ordinary skill in the art. The example should not be construed as limiting the invention, as the example merely provides specific methodology useful in understanding and practicing an embodiment of the invention.

Three sets of cellulosic fibers were formed. A first set of cellulosic fibers was used as a control set. For the first set of cellulosic fibers, 8.00 g of N-methyl morpholine oxide solvent (97 percent NMMO, available from Aldrich Chemical Co., Milwaukee, Wis.), 1.00 g of microcrystalline cellulose (available from Aldrich Chemical Co., Milwaukee, Wis.), and 1.00 g of deionized water were combined in a 20 ml glass vial to yield a solution with 10 percent by weight of cellulose. The vial was placed in a 125° C. oven and periodically mixed until its contents were homogenously mixed. The contents were then poured into a preheated 10 ml syringe and slowly squeezed into a coagulation bath of warm, stirred water to form the first set of cellulosic fibers.

For a second set of cellulosic fibers, 0.90 g of deionized water and 0.20 g of water-wetted microcapsules containing a phase change material (microencapsulated paraffin PCM, 120 J/g latent heat, 33° C. melting point, 50 percent microcapsules, available from Ciba Specialty Chemical Co., Bradford, United Kingdom) were combined in a 20 ml glass vial. Next, 8.00 g of N-methyl morpholine oxide solvent (97 percent NMMO, available from Aldrich Chemical Co., Milwaukee, Wis.) and 0.90 g of microcrystalline cellulose (available from Aldrich Chemical Co., Milwaukee, Wis.) were added to yield a solution with 10 percent by weight of solids. The solids included a 90/10 weight ratio of cellulose/microcapsules containing the phase change material. The vial was placed in a 125° C. oven and periodically mixed until its contents were homogenously mixed. The contents were then poured into a preheated 10 ml syringe and slowly squeezed into a coagulation bath of warm, stirred water to form lyocell-type cellulosic fibers with enhanced reversible thermal properties.

For a third set of cellulosic fibers, 0.80 g of deionized water and 0.31 g of water-wetted microcapsules containing a phase change material (microencapsulated paraffin PCM, 154 J/g latent heat, 31° C. melting point, 32 percent microcapsules, available from J&C Microchem Inc., Korea) were combined in a 20 ml glass vial. Next, 8.00 g of N-methyl morpholine oxide solvent (97 percent NMMO, available from Aldrich Chemical Co., Milwaukee, Wis.) and 0.90 g of microcrystalline cellulose (available from Aldrich Chemical Co., Milwaukee, Wis.) were added to yield a solution with 10 percent by weight of solids. The solids included a 90/10 weight ratio of cellulose/microcapsules containing the phase change material. The vial was placed in a 125° C. oven and periodically mixed until its contents were homogenously mixed. The contents were then poured into a preheated 10 ml syringe and slowly squeezed into a coagulation bath of warm, stirred water to form lyocell-type cellulosic fibers with enhanced reversible thermal properties.

The three sets of cellulosic fibers were filtered and dried, and thermal measurements were made using Differential Scanning Calorimetry (DSC). Table 4 sets forth results of these thermal measurements for the three sets of cellulosic fibers.

TABLE 4

| Cellulosic Fibers | Melting Point (° C.) | Latent Heat (J/g) |
|---|---|---|
| First Set (Control Set) | None | None |
| Second Set | 31.3 | 9.8 |
| Third Set | 32.4 | 13.5 |

A practitioner of ordinary skill in the art should require no additional explanation in developing the cellulosic fibers described herein but may nevertheless find some helpful guidance by examining the book of Kadolph et al., "Textiles," Chapter 7—Manufactured Regenerated Fibers (8th ed., Prentice-Hall, Inc. 1998) and the patent of Hills, entitled "Method of Making Plural Component Fibers," U.S. Pat. No. 5,162,074, the disclosures of which are incorporated herein by reference in their entireties. A practitioner of ordinary skill in the art may also find some helpful guidance by examining the patent applications of Hartmann, entitled "Stable Phase Change Materials For Use In Temperature Regulating Synthetic Fibers, Fabrics And Textiles," U.S. application Ser. No. 09/960,901, filed on Sep. 21, 2001, and Hartmann et al., entitled "Melt Spinnable Concentrate Pellets Having Enhanced Reversible Thermal Properties," U.S. application Ser. No. 09/777,512, filed Feb. 6, 2001, the disclosures of which are incorporated herein by reference in their entireties.

Each of the patent applications, patents, publications, and other published documents mentioned or referred to in this specification is herein incorporated by reference in its entirety, to the same extent as if each individual patent application, patent, publication, and other published document was specifically and individually indicated to be incorporated by reference.

While the invention has been described with reference to the specific embodiments thereof, it should be understood by those skilled in the art that various changes may be made and equivalents may be substituted without departing from the true spirit and scope of the invention as defined by the appended claims. In addition, many modifications may be made to adapt a particular situation, material, composition of matter, method, process step or steps, to the objective, spirit and scope of the invention. All such modifications are intended to be within the scope of the claims appended hereto. In particular, while the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A cellulosic fiber having enhanced reversible thermal properties, comprising:
a fiber body formed of an elongated member, the elongated member including a blend of a cellulosic material and a non-encapsulated phase change material, the non-encapsulated phase change material forming a plurality of domains dispersed within the cellulosic material, the non-encapsulated phase change material having a transition temperature in the range of 15° C. to 45° C., the non-encapsulated phase change material providing thermal regulation based on at least one of melting and crystallization of the non-encapsulated phase change material at the transition temperature.

2. The cellulosic fiber of claim 1, wherein the cellulosic material includes one of cellulose and cellulose acetate.

3. The cellulosic fiber of claim 1, wherein the transition temperature of the non-encapsulated phase change material is in the range of 22° C. to 40° C.

4. The cellulosic fiber of claim 1, wherein the non-encapsulated phase change material includes a paraffinic hydrocarbon having 16 to 22 carbon atoms.

5. The cellulosic fiber of claim 1, wherein the non-encapsulated phase change material includes one of a polyethylene glycol, a polyethylene oxide, a polytetramethylene glycol, and a polyester.

6. The cellulosic fiber of claim 1, wherein the domains are substantially uniformly dispersed within the cellulosic material.

7. The cellulosic fiber of claim 1, wherein the elongated member includes from 10 percent to 30 percent by weight of the non-encapsulated phase change material.

8. The cellulosic fiber of claim 1, wherein the fiber body is formed of a plurality of elongated members, the plurality of elongated members including the elongated member.

9. The cellulosic fiber of claim 8, wherein the plurality of elongated members are arranged in one of an island-in-sea configuration, a segmented-pie configuration, a core-sheath configuration, a side-by-side configuration, and a striped configuration.

10. The cellulosic fiber of claim 1, wherein the fiber body is between 0.1 and 100 denier.

11. A cellulosic fiber having enhanced reversible thermal properties, comprising:
a first elongated member, the first elongated member including a first cellulosic material and a temperature regulating material dispersed within the first cellulosic material, the temperature regulating material including a phase change material having a transition temperature in the range of 0° C. to 50° C.; and
a second elongated member coupled to the first elongated member, the second elongated member including a second cellulosic material.

12. The cellulosic fiber of claim 11, wherein at least one of the first cellulosic material and the second cellulosic material includes cellulose.

13. The cellulosic fiber of claim 11, wherein at least one of the first cellulosic material and the second cellulosic material includes cellulose acetate.

14. The cellulosic fiber of claim 11, wherein the transition temperature of the phase change material is in the range of 22° C. to 40° C.

15. The cellulosic fiber of claim 11, wherein the phase change material includes a paraffinic hydrocarbon having 13 to 28 carbon atoms.

16. The cellulosic fiber of claim 11, wherein the phase change material is a solid/solid phase change material.

17. The cellulosic fiber of claim 11, wherein the phase change material is a polymeric phase change material.

18. The cellulosic fiber of claim 11, wherein the temperature regulating material further includes a plurality of microcapsules that contain the phase change material.

19. The cellulosic fiber of claim 11, wherein the first elongated member includes from 10 percent to 30 percent by weight of the temperature regulating material.

20. The cellulosic fiber of claim 11, wherein the temperature regulating material is a first temperature regulating material, the phase change material is a first phase change material, the second elongated member further includes a second temperature regulating material dispersed within the second cellulosic material, and the second temperature regulating material includes a second phase change material having a transition temperature in the range of 0° C. to 50° C.

21. The cellulosic fiber of claim 11, wherein the first elongated member is positioned within and surrounded by the second elongated member.

22. The cellulosic fiber of claim 11, wherein the first elongated member substantially extends through a length of the cellulosic fiber, and the second elongated member surrounds the first elongated member and forms an exterior of the cellulosic fiber.

23. A cellulosic fiber having enhanced reversible thermal properties, comprising:
   a core member, the core member including a core polymeric material and a phase change material dispersed within the core polymeric material, the phase change material having a transition temperature in the range of 15° C. to 45° C.; and
   a sheath member surrounding the core member and forming an exterior of the cellulosic fiber, the sheath member including a sheath cellulosic material.

24. The cellulosic fiber of claim 23, wherein the transition temperature of the phase change material is in the range of 22° C. to 40° C.

25. The cellulosic fiber of claim 23, wherein the phase change material is a polymeric phase change material.

26. The cellulosic fiber of claim 23, wherein the phase change material includes one of a polyethylene glycol, a polyethylene oxide, a polytetramethylene glycol, and a polyester.

27. The cellulosic fiber of claim 23, wherein the core polymeric material is a core cellulosic material, and the phase change material is dispersed within the core cellulosic material.

28. The cellulosic fiber of claim 27, wherein the core member is formed from a blend of the core cellulosic material and the phase change material.

29. The cellulosic fiber of claim 27, wherein at least one of the core cellulosic material and the sheath cellulosic material includes cellulose.

30. The cellulosic fiber of claim 27, wherein at least one of the core cellulosic material and the sheath cellulosic material includes cellulose acetate.

31. The cellulosic fiber of claim 27, wherein the core cellulosic material and the sheath cellulosic material are different.

32. The cellulosic fiber of claim 27, wherein the core member further includes a containment structure that contains the phase change material, and the containment structure is dispersed within the core cellulosic material.

33. The cellulosic fiber of claim 32, wherein the containment structure includes a plurality of microcapsules having diameters in the range of 0.5 to 3 microns.

34. The cellulosic fiber of claim 27, wherein the core member includes from 10 percent to 30 percent by weight of the phase change material.

35. The cellulosic fiber of claim 23, wherein the core member is concentrically positioned within the sheath member.

36. The cellulosic fiber of claim 23, wherein the core member is eccentrically positioned within the sheath member.

37. A cellulosic fiber having enhanced reversible thermal properties, comprising:
   a plurality of island members, at least one island member of the plurality of island members including a phase change material having a transition temperature in the range of 15° C. to 45° C.; and
   a sea member surrounding each of the plurality of island members and forming an exterior of the cellulosic fiber, the sea member including a sea cellulosic material.

38. The cellulosic fiber of claim 37, wherein the transition temperature of the phase change material is in the range of 22° C. to 40° C.

39. The cellulosic fiber of claim 38, wherein the transition temperature of the phase change material is in the range of 22° C. to 28° C.

40. The cellulosic fiber of claim 37, wherein the phase change material is a polymeric phase change material having a melting temperature in the range of 22° C. to 40° C.

41. The cellulosic fiber of claim 37, wherein the at least one island member further includes an island cellulosic material, and the phase change material is dispersed within the island cellulosic material.

42. The cellulosic fiber of claim 41, wherein the at least one island member is formed from a blend of the island cellulosics material and the phase change material.

43. The cellulosic fiber of claim 41, wherein at least one of the island cellulosic material and the sea cellulosic material includes cellulose.

44. The cellulosic fiber of claim 41, wherein at least one of the island cellulosic material and the cellulosics material includes cellulose acetate.

45. The cellulosic fiber of claim 41, wherein the island cellulosic material and the sea cellulosic material are different.

46. The cellulosic fiber of claim 41, wherein the at least one island member further includes a plurality of microcapsules that contain the phase change material, and the plurality of microcapsules are dispersed within the island cellulosic material.

47. The cellulosic fiber of claim 41, wherein the at least one island member includes from 10 percent to 30 percent by weight of the phase change material.

48. The cellulosic fiber of claim 47, wherein the at least one island member includes from 15 percent to 25 percent by weight of the phase change material.

49. The cellulosic fiber of claim 37, wherein the phase change material is an island phase change material, the sea member further includes a sea phase change material dispersed within the sea cellulosic material, and the sea phase change material has a transition temperature in the range of 15° C. to 45° C.

50. The cellulosic fiber of claim 49, wherein the island phase change material and the sea phase change material are different.

51. The cellulosic fiber of claim 37, wherein each of the plurality of island members substantially extends through a length of the cellulosic fiber.

* * * * *

(12) EX PARTE REEXAMINATION CERTIFICATE (8249th)
United States Patent
Hartmann et al.

(10) Number: US 7,244,497 C1
(45) Certificate Issued: May 17, 2011

(54) CELLULOSIC FIBERS HAVING ENHANCED REVERSIBLE THERMAL PROPERTIES AND METHODS OF FORMING THEREOF

(75) Inventors: Mark Henry Hartmann, Superior, CO (US); James Brice Worley, Westminster, CO (US)

(73) Assignee: Outlast Technologies, Inc., Boulder, CO (US)

Reexamination Request:
No. 90/010,121, Apr. 17, 2008

Reexamination Certificate for:
Patent No.: 7,244,497
Issued: Jul. 17, 2007
Appl. No.: 10/638,290
Filed: Aug. 7, 2003

Related U.S. Application Data

(63) Continuation-in-part of application No. 10/052,232, filed on Jan. 15, 2002, now Pat. No. 6,855,422, which is a continuation-in-part of application No. 09/960,591, filed on Sep. 21, 2001, now abandoned.

(51) Int. Cl.
*D02G 3/00* (2006.01)
*D01F 1/10* (2006.01)
*D01F 8/04* (2006.01)
*D03D 15/00* (2006.01)
*D04B 1/16* (2006.01)
*D04B 21/00* (2006.01)
*B32B 5/16* (2006.01)
*H05K 1/03* (2006.01)

(52) U.S. Cl. .................. 428/373; 428/393; 428/401; 428/402

(58) Field of Classification Search .................. None
See application file for complete search history.

(56) References Cited

U.S. PATENT DOCUMENTS

| | | | |
|---|---|---|---|
| 1,902,529 | A | 3/1933 | Stockley |
| 4,756,958 | A | 7/1988 | Bryant et al. |
| 4,908,238 | A | 3/1990 | Vigo et al. |
| 5,993,710 | A | 11/1999 | Weigel et al. |
| 6,319,599 | B1 | 11/2001 | Buckley |
| 7,160,612 | B2 | 1/2007 | Magill et al. |
| 2002/0054964 | A1 | 5/2002 | Hartmann |
| 2003/0035951 | A1 | 2/2003 | Magill et al. |
| 2005/0164585 | A1 | 7/2005 | Magill et al. |
| 2005/0191487 | A1 | 9/2005 | Magill et al. |
| 2005/0208286 | A1 | 9/2005 | Hartmann et al. |
| 2007/0026228 | A1 | 2/2007 | Hartmann et al. |
| 2007/0160836 | A1 | 7/2007 | Magill et al. |
| 2007/0161306 | A1 | 7/2007 | Magill et al. |
| 2007/0165990 | A1 | 7/2007 | Magill et al. |
| 2007/0287008 | A1 | 12/2007 | Hartmann et al. |

FOREIGN PATENT DOCUMENTS

| | | | |
|---|---|---|---|
| AT | 384628 | B1 | 5/1987 |
| DE | 2164189 | A1 | 8/1972 |
| DE | 4446491 | C2 | 6/1996 |
| DE | 3751894 | T2 | 9/1996 |
| DE | 202004021259 | U1 | 5/2007 |
| EP | 0311642 | B1 | 9/1996 |
| GB | 1390939 | A1 | 4/1975 |
| GB | 2121069 | A | 12/1983 |
| GB | 2121069 | A1 | 12/1983 |
| GB | 2324064 | A | 10/1998 |
| JP | 08170224 | A | 7/1996 |
| JP | 2000192326 | A1 | 7/2000 |
| JP | 2000192326 | A | 7/2000 |
| WO | WO-98/46814 | A1 | 10/1998 |
| WO | 9846814 | A1 | 10/1998 |
| WO | 03027365 | A1 | 4/2003 |
| WO | 2005024102 | A1 | 3/2005 |

OTHER PUBLICATIONS

Collins, Monosaccharides: Their Chemistry and their Roles in Natural Products, p. 489, 1995.*

Lorenz and Kollegen, "Response to Request for Nullification of German Utility Model No. DE 20 2004 021 259.5", Jul. 9, 2008, Published in: Germany.

Exxonmobil Corporation, "Mobilcer 46—Emulsion de cera", Unknown, Published in: Argentina.

USPTO/Lynda Salvatore, "Office Action dated Jun. 23, 2007 in U.S. Appl. No. 11/495,156", Jun. 29, 2007, p. 10, Published in: US.

Outlast Technologies, Inc., "Office Action Response dated Dec. 10, 2007 in U.S. Appl. No. 11/495,156", Jun. 29, 2007, p. 8, Published in: US.

Taiwan IP Office, "Taiwan Patent Office Office Action in Taiwan Patent Application No. 91100612", Jun. 5, 2003, p. 6, Publisher: Taiwan Intellectual Property Office, Published in: Taiwan.

International Bureau of WIPO, "International Preliminary Report on Patentability, Search Report and Written Opinion in Application No. PCTUS2004024283", Feb. 13, 2006, p. 9, Published in: CH.

International Bureau of WIPO, "Written Opinion of the International Searching Authority in Application No. PCTUS0773789", Dec. 27, 2007, p. 5, Published in: US.

(Continued)

*Primary Examiner*—Dwayne C Jones

(57) ABSTRACT

Cellulosic fibers having enhanced reversible thermal properties and methods of forming such cellulosic fibers are described. In one embodiment, a cellulosic fiber includes a fiber body formed of an elongated member. The elongated member includes a cellulosic material and a temperature regulating material dispersed within the cellulosic material. The temperature regulating material includes a phase change material having a transition temperature in the range of −5° C. to 125° C. The cellulosic fiber can be formed via a solution spinning process and can be used in various products where thermal regulating properties are desired. For example, the cellulosic fiber can be used in textiles, apparel, footwear, medical products, containers and packagings, buildings, appliances, and other products.

OTHER PUBLICATIONS

International Bureau of WIPO, "Notification of transmittal of the international search report and the written opinion in Application No. PCTUS0773789", Dec. 27, 2007, p. 3, Published in: US.

Zounek Plate Schweitzer, "Request for Nullification of German Utility Model No. DE 20 2004 021 259 U1", Dec. 4, 2007, Published in: Germany.

Falbe and Regitz, "Rompp Chemie Lexicon", 1989, Pages(s) Various, No. 9th Ed., Publisher: Georg Thieme Verlag, Published in: Stuttgart/New York.

German Patent Office, "Office Action Letter in Nullification Action for DE 20 2004 021 259", Sep. 15, 2008, p. 4, Publisher: German Patent Office, Published in: Germany.

Summary English Translation of German Patent Office, "Office Action Letter in Nullification Action for DE 20 2004 021 259", Sep. 15, 2008, p. 1.

European Patent Office, "Supplementary European Search Report in Application No. EP 04 75 7345", Oct. 10, 2008, p. 2, Published in: The Hague.

Tao, Xiaoming, "Smart Fibres, Fabrics and Clothing", 2001, pp. 34-57, Publisher: Woodhead Publishing, XP002492889, Published in: US.

German Patent Office, Written Argumentation in German Nullification Action re German Utility Model No. 20 2004 021 259, Mar. 18, 2009, 18 pages.

Fable and Regitz, "Paraffin," Rompp Chemie Lexikon, 1991, p. 3216, 9th Edition, George Theime Verlag, Stuttgart/New York.

Fable and Regitz, "Alkane," Rompp Chemie Lexikon, 1989, p. 102, 9th Edition, george Theime Verlag, Stuttgart/New York.

* cited by examiner

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1, 2, 11, 23 and 37 are determined to be patentable as amended.

Claims 3-10, 12, 17 and 38-40, dependent on an amended claim, are determined to be patentable.

Claims 13-16, 18-22, 24-36 and 41-51 were not reexamined.

1. A cellulosic fiber having enhanced reversible thermal properties, comprising:
   a fiber body formed of an elongated member, the elongated member including a blend of a cellulosic material and a non-encapsulated phase change material,
   the non-encapsulated phase change material *having a latent heat between 9.8 Joules per gram and 154 Joules per gram and* forming a plurality of domains dispersed within the cellulosic material, the non-encapsulated phase change material having a transition temperature in the range of 15° C. to 45° C., the non-encapsulated phase change material providing thermal regulation based on at least one of [melting and crystallization of the non-encapsulated phase change material] *absorption and release of the latent heat* at the transition temperature, *wherein the cellulosic fiber includes from 5 percent to 70 percent by weight of the non-encapsulated phase change material*.

2. The cellulosic fiber of claim 1, wherein the cellulosic material includes *at least* one of cellulose and cellulose acetate.

11. A cellulosic fiber having enhanced reversible thermal properties, comprising:
   a first elongated member, the first elongated member including a first cellulosic material and a temperature regulating material dispersed within the first cellulosic material, the temperature regulating material including a *non-encapsulated* phase change material having a transition temperature in the range of 0° C. to 50° C. *and a latent heat between 9.8 Joules per gram and 154 Joules per gram*; and
   a second elongated member coupled to the first elongated member, the second elongated member including a second cellulosic material,
   *the non-encapsulated phase change material providing thermal regulation based on at least one of absorption and release of the latent heat at the transition temperature.*

23. A cellulosic fiber having enhanced reversible thermal properties, comprising:
   a core member, the core member including a core polymeric material and a *non-encapsulated* phase change material dispersed within the core polymeric material,
   the *non-encapsulated* phase change material having *a latent heat between 9.8 Joules per gram and 154 Joules per gram and* a transition temperature in the range of 15° C. to 45° C.; and
   a sheath member surrounding the core member and forming an exterior of the cellulosic fiber, the sheath member including a sheath cellulosic material,
   *the non-encapsulated phase change material providing thermal regulation based on at least one of absorption and release of the latent heat at the transition temperature.*

37. A cellulosic fiber having enhanced reversible thermal properties, comprising:
   a plurality of island members, at least one island member of the plurality of island members including a *non-encapsulated* phase change material having *a latent heat between 9.8 Joules per gram and 154 Joules per gram and a* transition temperature in the range of 15° C. to 45° C.; and
   a sea member surrounding each of the plurality of island members and forming an exterior of the cellulosic fiber, the sea member including a sea cellulosic material,
   *the non-encapsulated phase change material providing thermal regulation based on at least one of absorption and release of the latent heat at the transition temperature.*

* * * * *